United States Patent [19]

Kobayashi et al.

[11] Patent Number: 5,379,264

[45] Date of Patent: Jan. 3, 1995

[54] SEMICONDUCTOR MEMORY DEVICE CAPABLE OF MULTIDIRECTION DATA ACCESS

[75] Inventors: Kazuya Kobayashi, Tokyo; Kiyoshi Miyasaka; Junji Ogawa, both of Yokohama, all of Japan

[73] Assignee: Fujitsu Limited, Kanagawa, Japan

[21] Appl. No.: 214,161

[22] Filed: Mar. 17, 1994

Related U.S. Application Data

[63] Continuation of Ser. No. 782,719, Oct. 28, 1991, abandoned, which is a continuation of Ser. No. 483,965, Feb. 15, 1990, abandoned, which is a continuation of Ser. No. 88,334, Aug. 21, 1987, abandoned.

[30] Foreign Application Priority Data

| Aug. 22, 1986 | [JP] | Japan | 61-196529 |
| Dec. 4, 1986 | [JP] | Japan | 61-289677 |
| Dec. 4, 1986 | [JP] | Japan | 61-289680 |
| Jan. 19, 1987 | [JP] | Japan | 62-009493 |

[51] Int. Cl.⁶ .................. G11C 8/00; G11C 7/00; G09G 1/02; G06F 12/00

[52] U.S. Cl. .................. 365/230.06; 365/238.5; 345/190; 345/200; 395/400

[58] Field of Search .............. 395/425, 400, 164, 166; 365/238.5, 230.03, 230.04, 230.05, 230.06, 189.01; 345/185, 189, 190, 200

[56] References Cited

U.S. PATENT DOCUMENTS

| 3,643,236 | 2/1972 | Kolankowsky et al. | 365/230 |
| 3,781,828 | 12/1973 | Ptatt et al. | 365/230 |
| 4,051,551 | 9/1977 | Lawrie et al. | 395/425 |
| 4,435,787 | 3/1984 | Yasuoka | 365/230.05 |
| 4,561,072 | 12/1985 | Arakawa et al. | 365/238.5 |
| 4,566,081 | 1/1986 | Ochii | 365/200 |
| 4,570,236 | 2/1986 | Rebel et al. | 395/400 |
| 4,597,063 | 6/1986 | Takemae | 365/230.06 |
| 4,651,308 | 3/1987 | Sato | 365/238.5 |
| 4,656,614 | 4/1987 | Suzuki | 365/230.05 |
| 4,667,308 | 5/1987 | Hayes et al. | 395/425 |
| 4,729,119 | 3/1988 | Dennison et al. | 365/238.5 |
| 4,742,474 | 5/1988 | Knierim | 365/230.03 |
| 4,773,048 | 9/1988 | Kai | 365/230.03 |

FOREIGN PATENT DOCUMENTS

| 0025155 | 3/1981 | European Pat. Off. . | |
| 0073486 | 3/1983 | European Pat. Off. | 365/230 |
| 0166642 | 1/1986 | European Pat. Off. . | |
| 0179605 | 4/1986 | European Pat. Off. . | |
| 0025860 | 2/1980 | Japan | 365/230 |
| 1469231 | 4/1977 | United Kingdom | 365/230 |

*Primary Examiner*—Glenn Gossage
*Attorney, Agent, or Firm*—Nikaido, Marmelstein, Murray & Oram

[57] ABSTRACT

A semiconductor memory device enables multi-direction data access at a high speed with a simple circuit construction. The semiconductor memory device includes a plurality of word lines, a plurality of bit lines and a plurality of memory cells connected to the bit lines and word lines. A row decoder, connected to the word lines, selects one of the word lines in response to a row address signal. A selection circuit includes a plurality of column decoders and a direction decoder. Each column decoder receives a portion of a column address signal and the direction decoder selects one of three directions in response to a direction address signal. Each column decoder is selectively enabled based upon the direction address signal. Output circuitry outputs data read out from bit lines selected by the enabled column decoders. Thus, three-dimensional bit map data can be stored in two dimensions.

5 Claims, 34 Drawing Sheets

Fig. 2
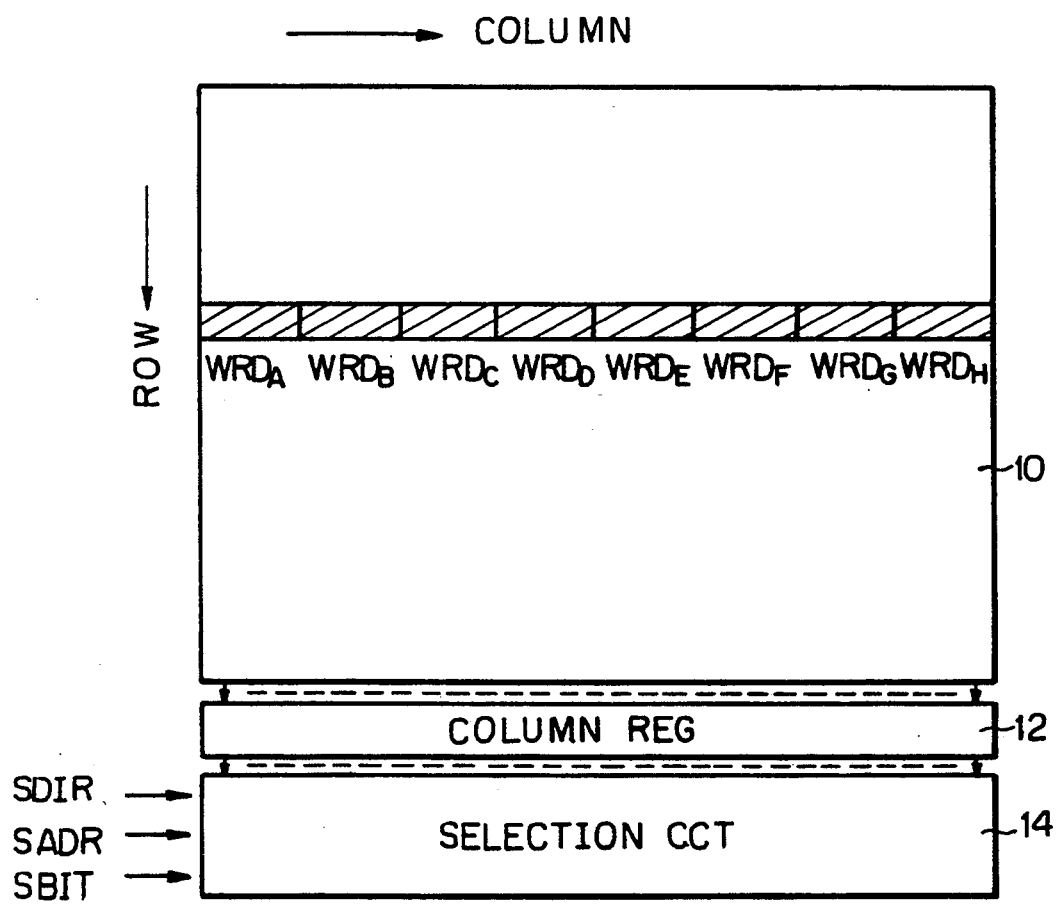
Fig. 3a    Fig. 3b    Fig. 3c
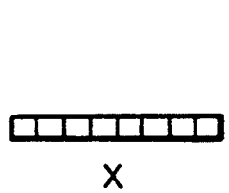
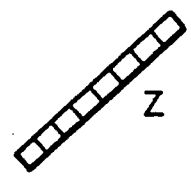

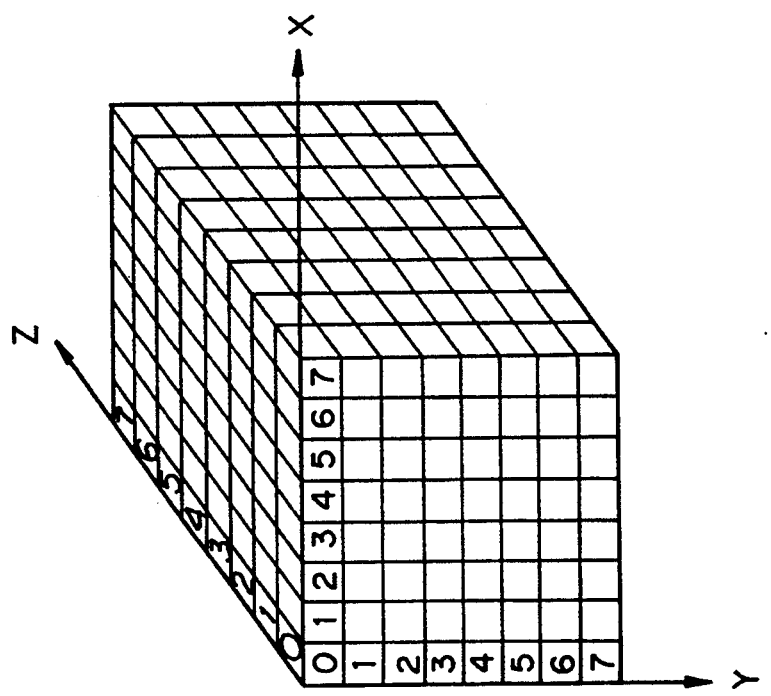

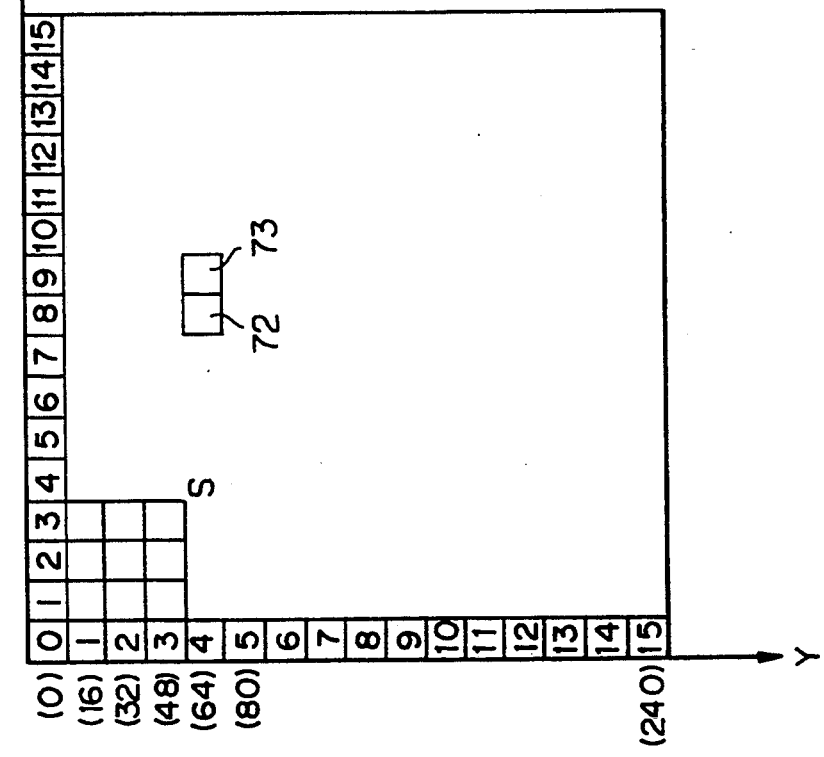

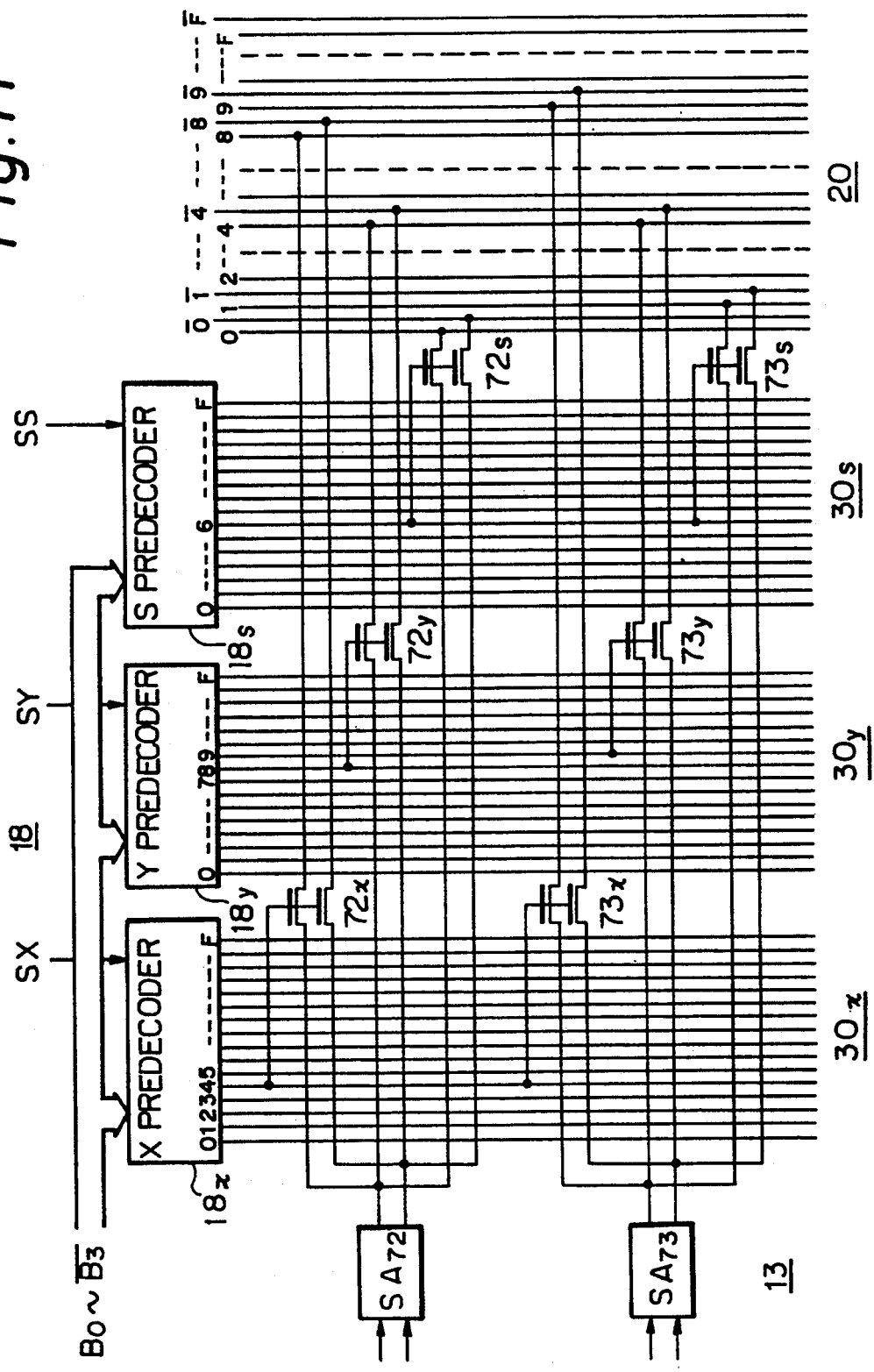

| SA0 | SA1 | SA2 | SA3 | | SA15 |
|---|---|---|---|---|---|
| SA16 | SA17 | SA18 | SA19 | | SA31 |
| SA32 | SA33 | SA34 | SA35 | | SA47 |
| SA48 | SA49 | SA50 | SA51 | | SA63 |
| SA64 | | | | | SA79 |
| SA80 | | | | | SA95 |

| Fig. 14a | Fig. 14 b |

Fig. 21a
16 x 16 x 16
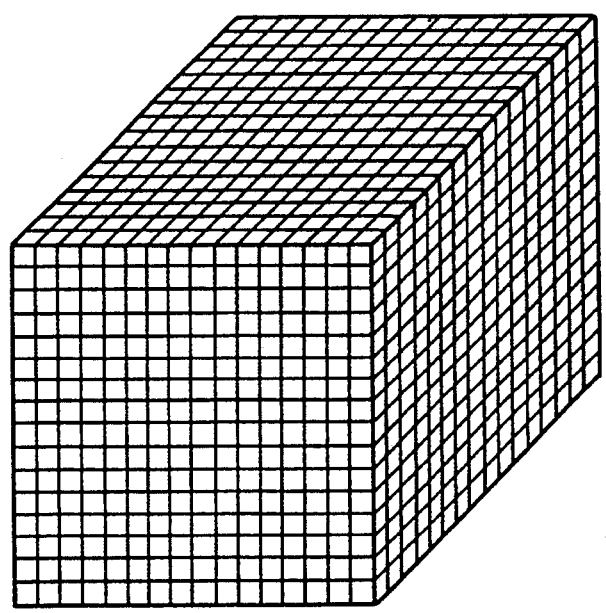
Fig. 21c
Fig. 21b
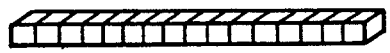
Fig. 21d
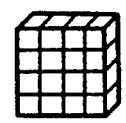
Fig. 21e    Fig. 21f    Fig. 21g
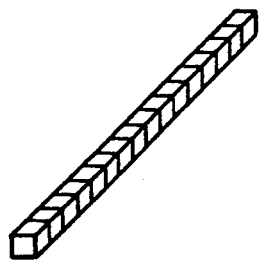 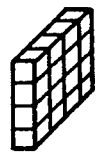 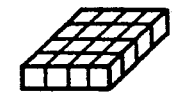

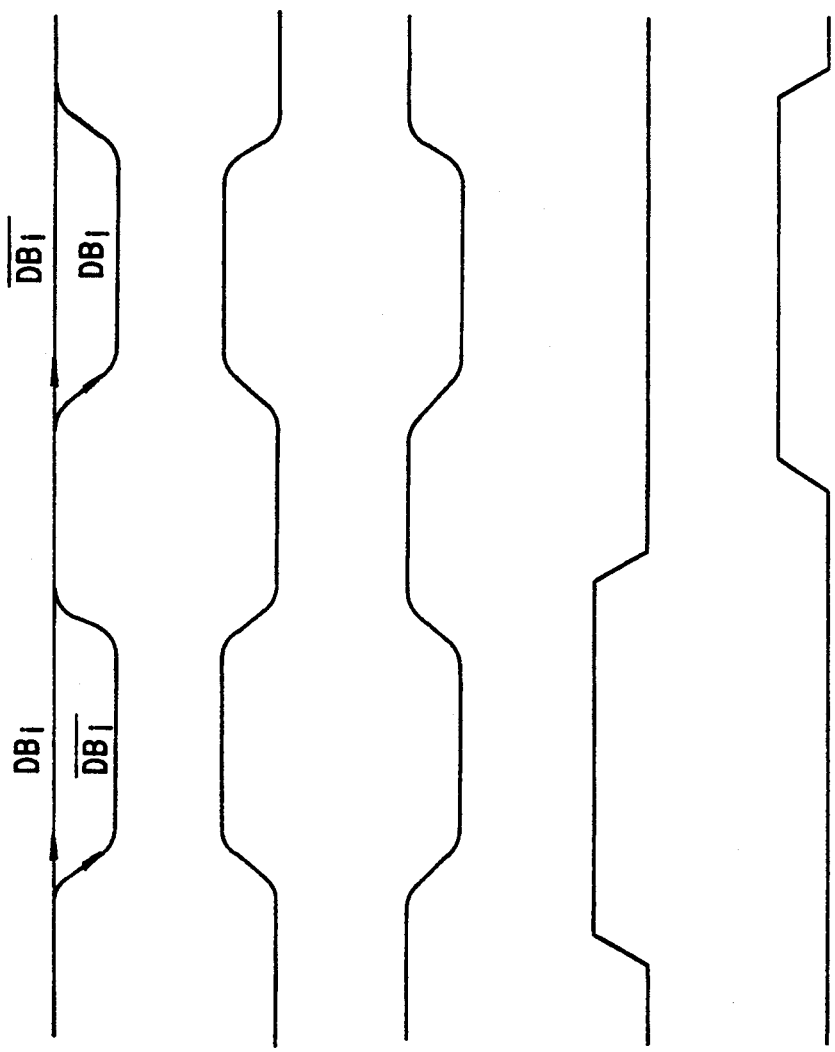

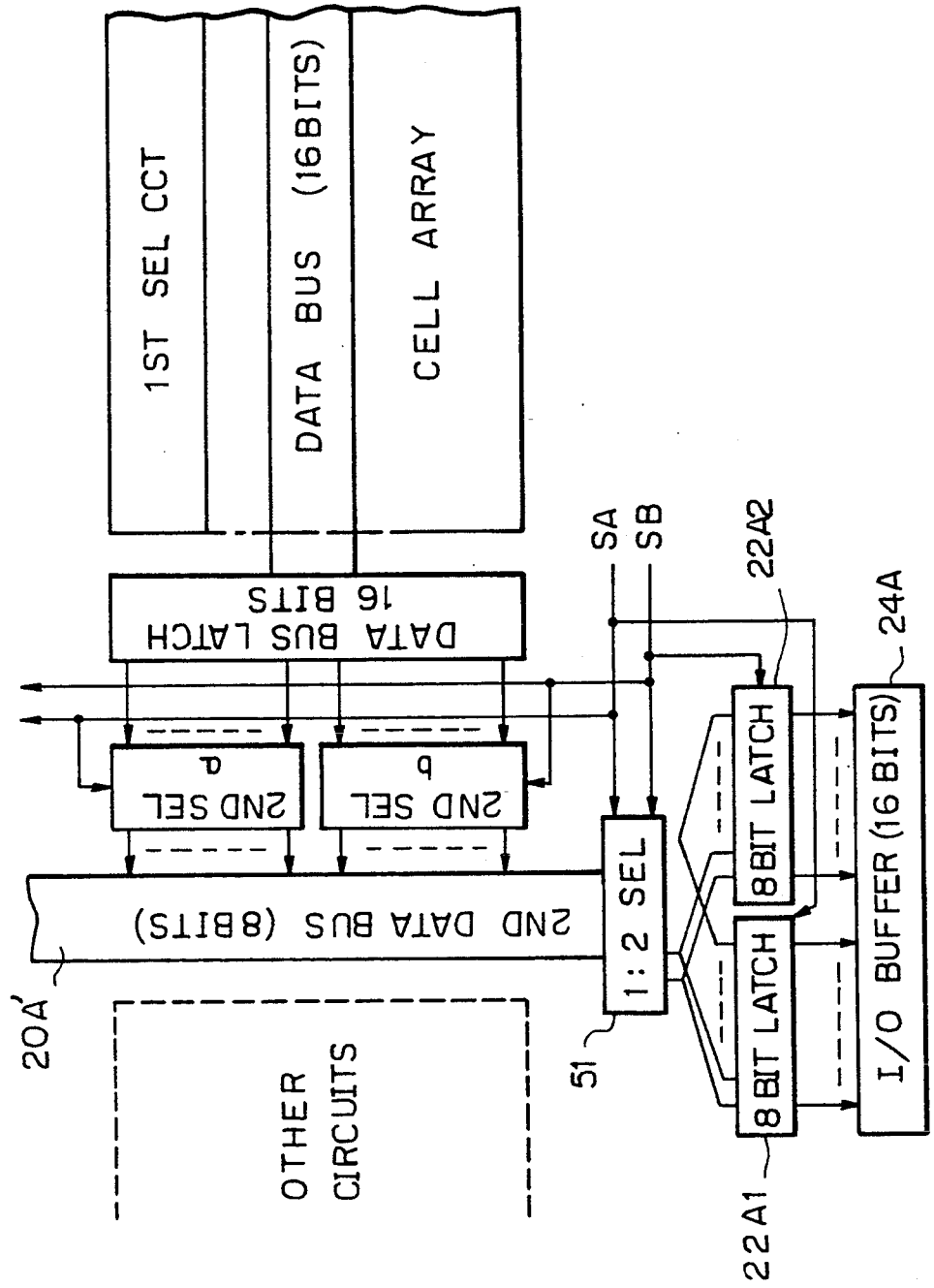

SEMICONDUCTOR MEMORY DEVICE CAPABLE OF MULTIDIRECTION DATA ACCESS

This application is a continuation of application Ser. No. 07/782,719, filed on Oct. 28, 1991, now abandoned, which is a continuation of application Ser. No. 07/483,965, filed on Feb. 15, 1990, now abandoned which a continuation of application Ser. No. 07/088,334, filed on Aug. 21, 1987, now abandoned.

BACKGROUND OF THE INVENTION

1. Field of the Invention

The present invention relates to a semiconductor memory device. More particularly, it relates to a semiconductor memory device enabling a multi-direction data selection, especially a two or more direction data read and/or write in a logical bit map space.

2. Description of the Related Art

In an image data processing system, for example, in a computer tomography (CT) scanning system, three dimensional bit map data are used and each data has a color and gradation indicating density. In the CT scanning system or the like, a high-speed reading of a plurality of data in a X-, Y- or plane-direction of a three dimension bit map space is required.

Conventional memory devices are essentially accessed in only one direction, for example, by a word line and bit lines. However, the conventional memory devices cannot achieve a multidirection access, in other words, a high dimension access, because, for example, in a two dimension logical bit map space, a plurality of bit data in a X direction can be read by one access, but a plurality of accesses for reading a plurality of bit data in a Y direction is required.

SUMMARY OF THE INVENTION

An object of the present invention is to provide a semiconductor memory device enabling a multidirection data read and/or write with a high speed.

Another object of the present invention is to provide a semiconductor memory device enabling a multi-direction data read and/or write with a simple circuit construction which results in a low power consumption and a high integration.

The above multidirection access means whereby, for example, in a two dimension logical bit map space, a plurality of bit data in a X-, Y- or plane direction can be read or written by a single access, and in a three dimension logical bit map space, a plurality of bit data in any direction can be read or written by a single access, and so on.

According to the present invention, there is provided a semiconductor memory device including: a plurality of word lines; a plurality of bit lines; a plurality of memory cells connected to the bit lines and the word lines; a first selection unit, operatively connected to the word lines, for selecting one of the word lines in response to a first address signal; and a second selection unit, operatively connected to the bit lines, for receiving a plurality of bit data from the bit lines and selecting at least two bit data from the received plurality of bit data in response to a second address signal, a relationship between the at least two bit data and the second address signal being changed in response to an access direction signal which designates one of the access directions.

The selection circuit may further include a circuit for inputting a plurality of bit data of at least two bits to be stored from an external circuit and sending the input data to the bit lines.

According to the present invention, there is also provided a semiconductor memory device including: a plurality of memory blocks, each having a plurality of word lines, a plurality of bit lines, a plurality of memory cells connected to the bit lines and the word lines, a first selection unit, operatively connected to the word lines, for selecting one of the word lines in response to a first address signal, and a second selection unit, operatively connected to the bit lines, for receiving a plurality of bit data from the bit lines and selecting at least two bit data from the received plurality of bit data in response to a second address signal. A relationship between the at least two bit data and the second address signal is changed in response to an access direction signal which designates one of the access directions. Each memory block further has a third selection unit, operatively connected to the second selection unit of each memory block, for selecting a plurality of bit data from the data selected by the second selection unit in response to a third address signal. Another relationship between the third address signal and the plurality of bit data selected by the third address signal is changed by the access direction signal.

According to the present invention, there is further provided a semiconductor memory device including: a plurality of memory units; a plurality of first selection units each operatively connected to the corresponding memory unit; a plurality of first data bus units each operatively connected to the corresponding first selection unit; a second selection unit operatively connected to the first selection units through the first data bus units; and a second data bus unit operatively connected to the plurality of second selection unit.

Each memory unit for storing and reading a plurality of bit data arranged in a multidimensional form, has a plurality of word lines, a plurality of bit lines and a plurality of memory cells operatively connected between the word lines and the bit lines to read or write a plurality of bit data therefrom or therein connected to a selected word line. Each of the first data bus units has a plurality of bus lines equal to at least two bit data to be selected. Each of the first selection units includes a plurality of selection circuits connected therebetween and connected to the bus lines of the corresponding first data bus unit, in a relationship for receiving a plurality of data on the bit lines and outputting the bit data selected from the received data in response to a first selection signal supplied to the first selection units and the connection of the relationship.

The second selection unit outputs bit data selected from the data on the first data bus units in response to a second selection signal to the second data bus unit.

Furthermore, according to the present invention, there is provided a semiconductor memory device including: a memory unit for storing and reading a plurality of bit data arranged in a multidimensional form; a plurality of selection units each operatively connected to the memory unit; and a data bus unit operatively connected to the selection units.

The memory unit has a plurality of word lines, a plurality of bit lines and a plurality of memory cells, operatively connected between the word lines and the bit lines to read or write a plurality of bit data therefrom or therein connected to a selected word line. The data bus unit has a plurality of bus lines equal to at least two bit data to be selected. Each of the selection units includes a plurality of selection circuits connected therebetween and connected to the bus lines, in a relationship for receiving a plurality of data on the bit lines and outputting the bit data selected from the received data in response to a first selection signal supplied to the selection units and the connection of the relationship.

The plurality of selection units are consecutively operated to receive data from the memory unit continuously accessed prior to the operation of the selection unit.

According to the present invention, there is provided a semiconductor memory system including: a plurality of memory units; a plurality of sets of first selection units, each set including a plurality of selection units operatively connected to the corresponding memory unit; a plurality of first data bus units each operatively connected to the corresponding first selection unit; a plurality of second selection units operatively connected to the first selection units through the first data bus units; and a second data bus unit operatively connected to the plurality of second selection units.

Each memory unit for storing and reading a plurality of bit data arranged in a multidimensional form, has a plurality of word lines, a plurality of bit lines and a plurality of memory cells operatively connected between the word lines and the bit lines to read or write a plurality of bit data therefrom or therein connected to a selected word line. Each of the first data bus units has a plurality of bus lines equal to at least two bit data to be selected. Each of the first selection units includes a plurality of selection circuits connected therebetween and connected to the bus lines of the corresponding first data bus unit, in a relationship for receiving a plurality of bit data on the bit lines and outputting the bit data selected from received data in response to a first selection signal supplied to the first selection units and the connection of the relationship.

The plurality of selection units are consecutively operated to receive data from the memory units continuously accessed prior to the operation of the selection units. The selection unit outputs data selected from the bit data on the first data bus unit in response to a second selection signal to the second data bus unit.

BRIEF DESCRIPTION OF THE DRAWINGS

Other objects and features of the present invention will be described below in detail with reference to the accompanying drawings, in which:

FIG. 2 is a block diagram of an embodiment of a semiconductor memory device in accordance with the present invention;

FIGS. 3a to 3c are views illustrating data output from the memory device shown in FIG. 2;

FIGS. 6, 6a and 6b are circuit diagrams of the memory device shown in FIG. 2 while

FIGS. 7a to 7d are views illustrating another three dimensional data arrangement;

FIGS. 8a to 8d are views illustrating still another three dimensional data arrangement;

FIG. 11 is a circuit diagram of still another selection circuit of the memory device shown in FIG. 2;

FIGS. 14, 14a and 14b are circuit diagrams of a selection circuit of the memory device shown in FIG. 13;

FIGS. 21a to 21g are views of a detailed arrangement selected from the memory device shown in FIG. 16;

FIGS. 30a to 30e are timing charts of a selection circuit shown in FIG. 28; and

FIG. 31 is a block diagram of still another embodiment of a semiconductor memory device according to the present invention.

DESCRIPTION OF THE PREFERRED EMBODIMENTS

Before describing the preferred embodiments of the present invention, an example of a prior art semiconductor memory system for an image display is described with reference to the drawings for a comparison.

Figure 1:
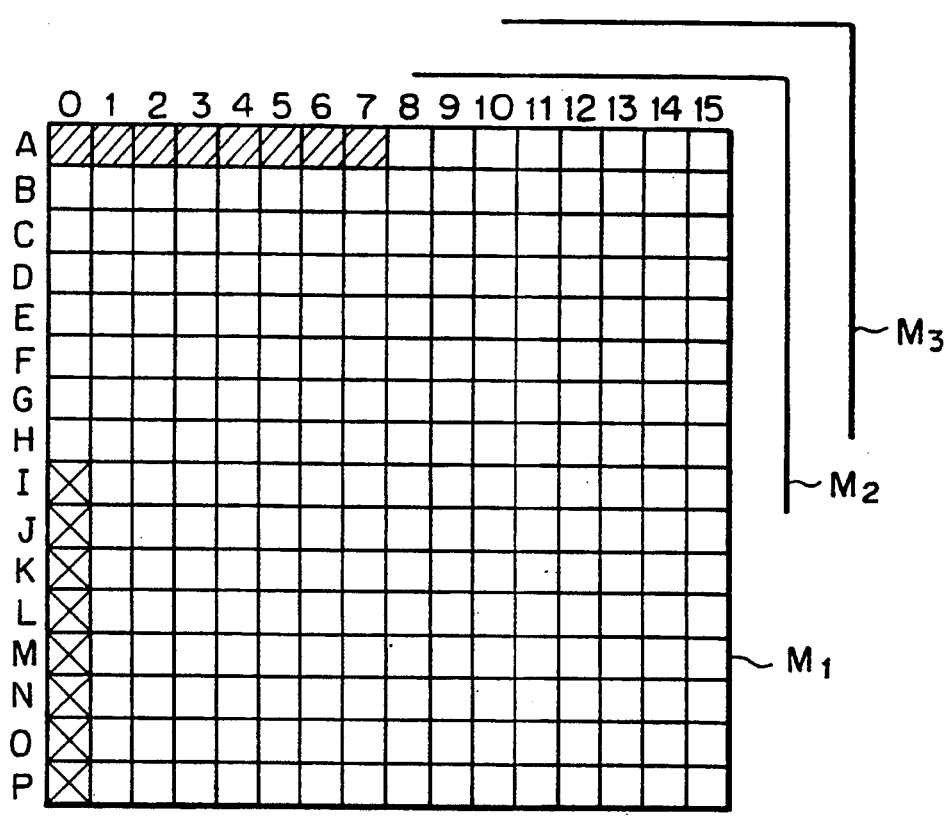
FIG. 1 is a view of a logical bit map space of a conventional memory system for image data processing.

As shown in FIG. 1, the memory system has a logical bit map space therein, i.e., each bit in the memory system corresponds to each picture element (PIXEL) in an image display unit, such as a CRT unit. The memory system includes three memory planes M1 to M3 storing image data for the colors red (R), green (G), and blue (B), respectively. In this example, each memory plane consists of $16 \times 16$ bits, but in practice, each memory plane has a large capacity of, for example, $512 \times 512$ bits or $1024 \times 1024$ bits.

In FIG. 1, a word consists of eight bits, as shown by shading. Numerals 0 to 15 correspond to bit lines and symbols A to P correspond to word lines. If one memory device consists of 8 bits (one word)×8 bits one word)=64 bits, each memory plane is formed by four memory devices, and thus three memory planes M1 to M3 are formed by twelve memory devices.

Eight bits ira word, along the word lines, can be simultaneously read from or written into the memory device. However, the reading or the writing of eight bits marked with crosses along the bit lines requires eight consecutive accesses, resulting in a long access time. To avoid this disadvantage, another approach which assigns the image data in a word line direction to other memories has been attempted. However, this approach still has a low performance when applied to a bulky memory device. In addition, the external circuits become complex, and since a plurality of memory devices must operate simultaneously, the power consumed thereat is increased. Furthermore, peripheral circuits of the memory planes for handling color, etc., become complex.

Referring to FIGS. 2 to 5g, a first embodiment of a semiconductor memory device in accordance with the present invention will be described.

Figure 4:
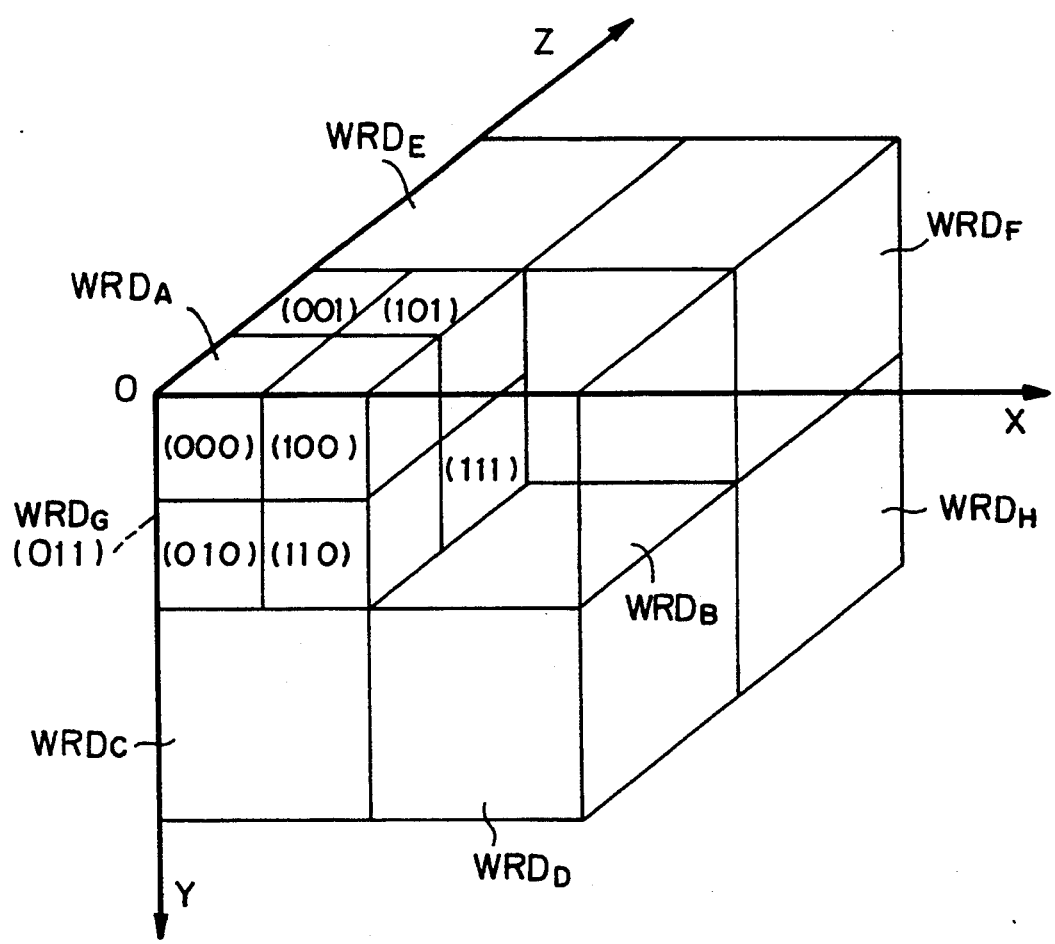
FIG. 4 is a view illustrating a three dimensional data arrangement of a global word shown in FIG. 2.

In FIG. 2, the memory device includes a memory cell array 10, a column register 12 and a selection circuit 14. Each global word in the memory cell array 10, as shown by shaded lines, consists of 64 bits, and each normal word consists of eight bits. Accordingly, each global word consists of eight normal words $WRD_A$ to $WRD_H$. The 64 bits in each global word can be simultaneously read or written. The eight normal words $WRD_A$ to $WRD_H$ are stored in a line formed in the memory cell array 10 as shown in FIG. 2, but correspond to three dimensional image data as shown in FIG. 4. Further, each word, for example, the word $WRD_A$, consisting of eight bits, also consists of three dimensional image data assigned by directions (000), (001), (010), (011), (100), (101), (110), and (111), and each image data consists of one bit. The eight words are virtually arranged in three dimensions, i.e., the X, Y, and Z directions.

First, the conceptual operation will be described.

Figure 5A:
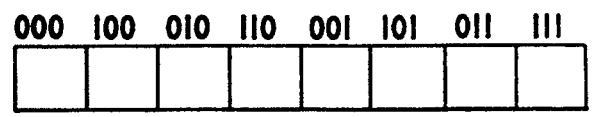
FIGS. 5a to 5d are views illustrating data selection of the memory device shown in FIG. 2.
Figure 5B:
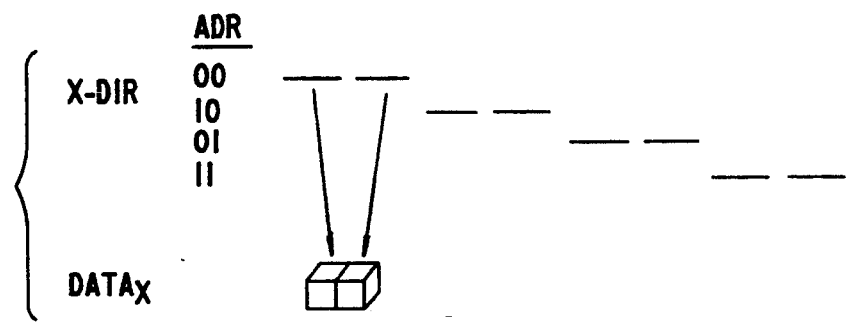
Figure 5C:
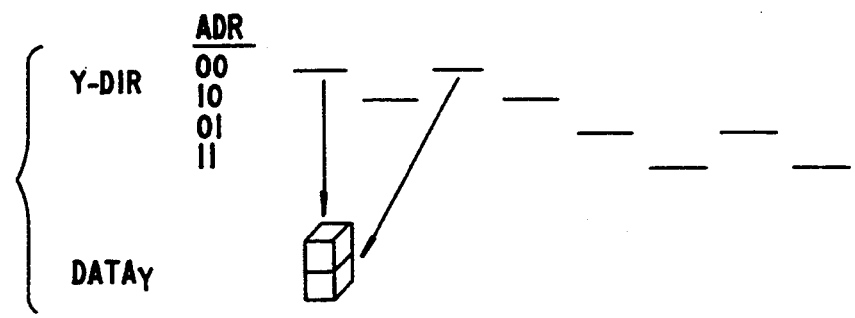
Figure 5D:
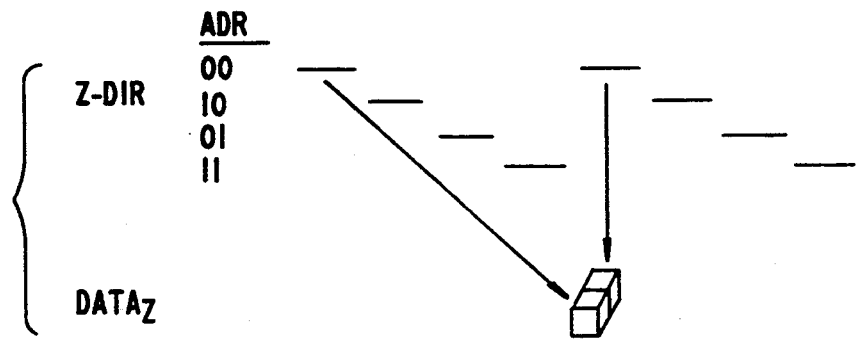

When a certain row is selected, a corresponding global word, as shown by hatching in FIG. 2, consisting of eight words $WRD_A$ to $WRD_H$, and thus formed by 64 bits, is output from the memory cell array 10 and once stored in the column register 12 of 64 bits. By designating the direction with the direction signal SDIR to the selection circuit 14, data in one direction of the X, Y, or Z directions can be output from the column register 12 as shown in FIGS. 3a to 3c. The direction signal SDIR consists of two bits able to designate the three directions. FIGS. 5a, 5b, 5c, and 5d show the above selection. In the drawings, solid lines indicate selected data combination in each direction. Further, by designating an address ADR in the drawings with an address signal SADR of two bits, a pair of image data can be selected as shown in FIGS. 5b, 5c and 5d. Furthermore, by designating a bit BIT with a bit signal SBIT, a desired image data can be selected. The above selections can be simultaneously effected. Table 1 is a summary of the above image data selection. In Table 1, the direction, the address, and the bit are binary-coded.

TABLE 1

| DIRECTION | ADDRESS | BIT |
|---|---|---|
| X = 00 | 00 | 000, 100 |
|  | 10 | 010, 110 |
|  | 01 | 001, 101 |
|  | 11 | 011, 111 |
| Y = 01 | 00 | 000, 010 |
|  | 10 | 100, 110 |
|  | 01 | 001, 011 |
|  | 11 | 101, 111 |
| Z = 10 | 00 | 000, 001 |
|  | 10 | 100, 101 |
|  | 01 | 010, 011 |
|  | 11 | 110, 111 |

Figure 6A:
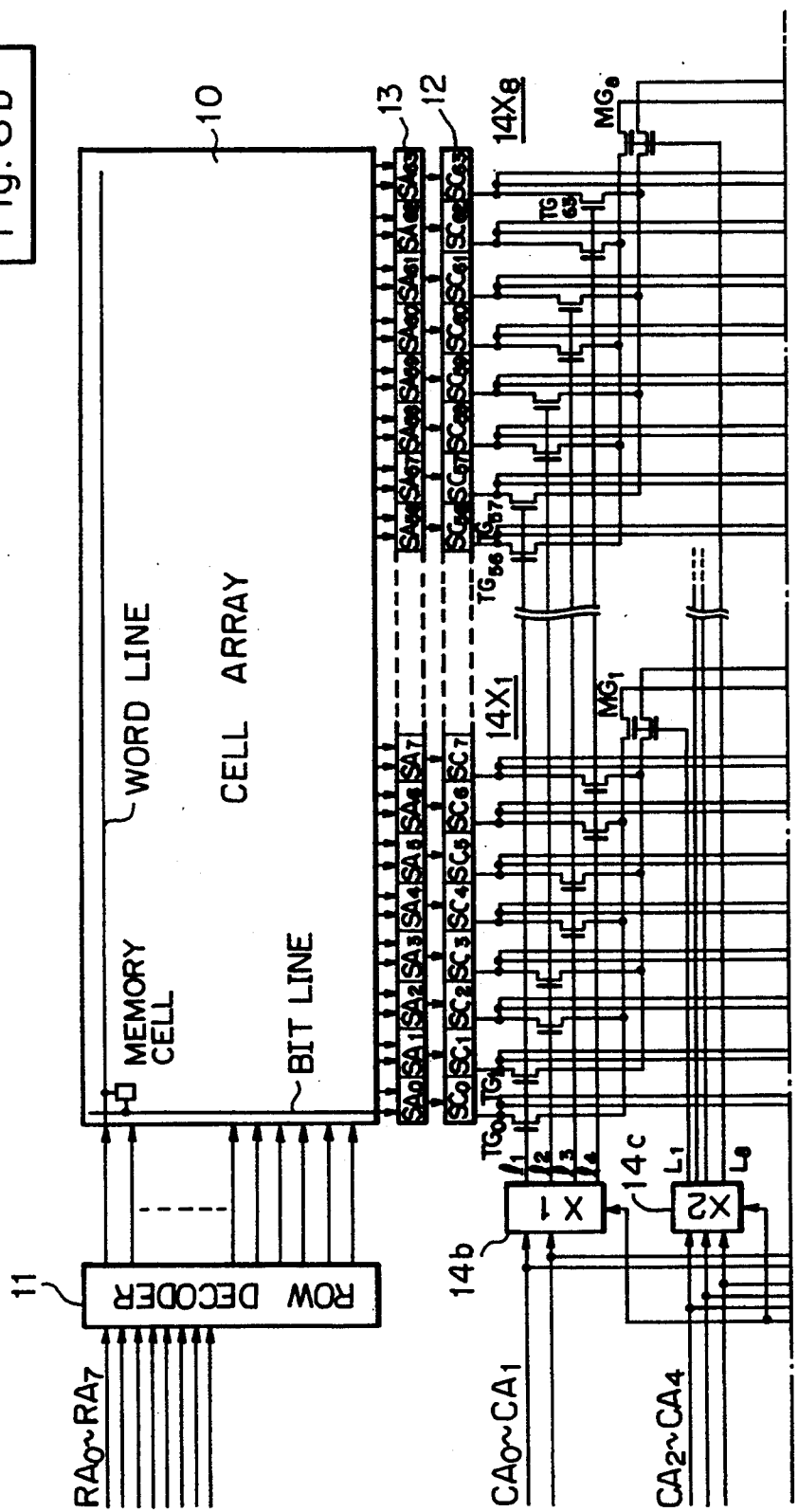
Figure 6B:
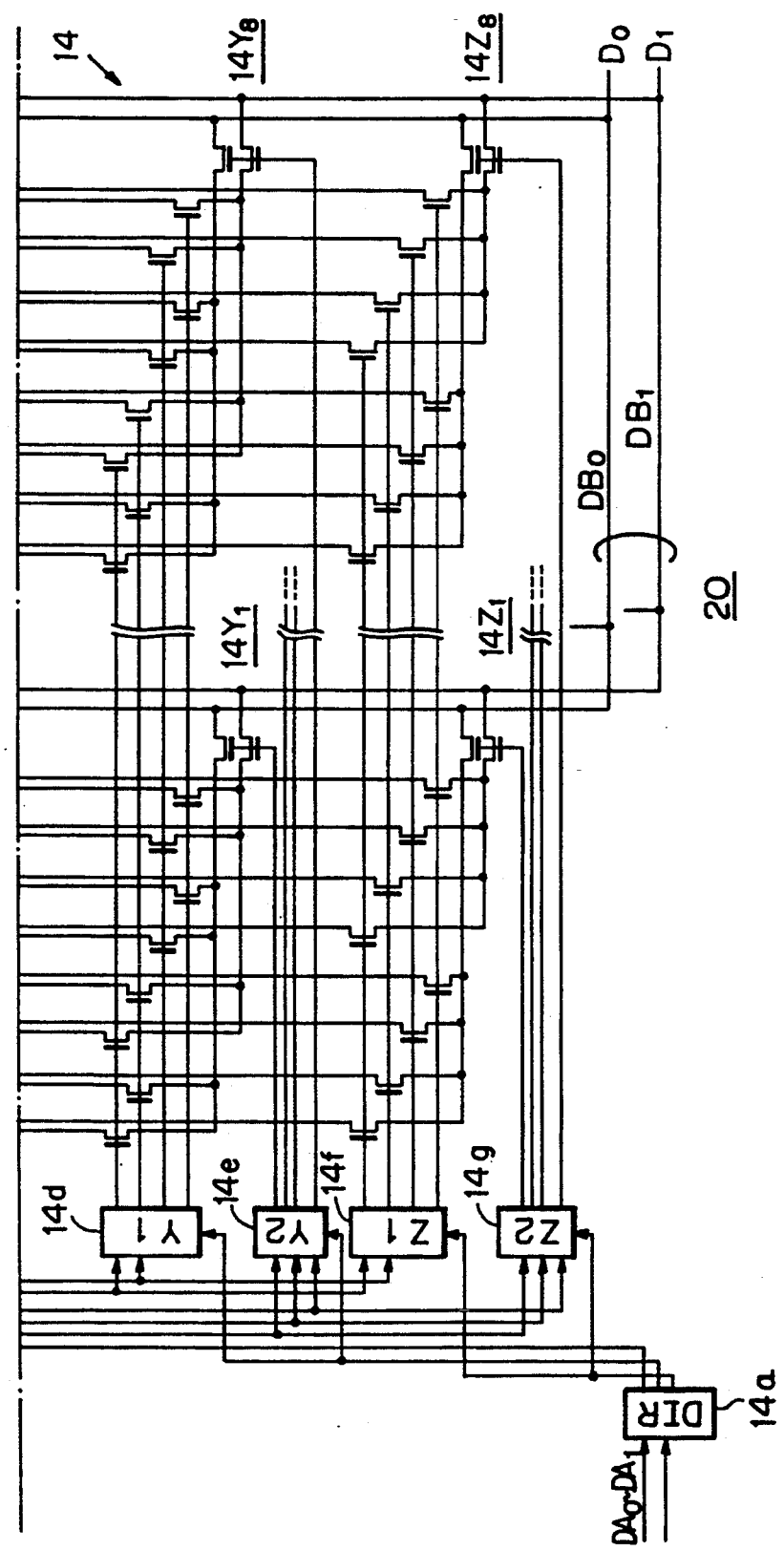
Figure 6C:
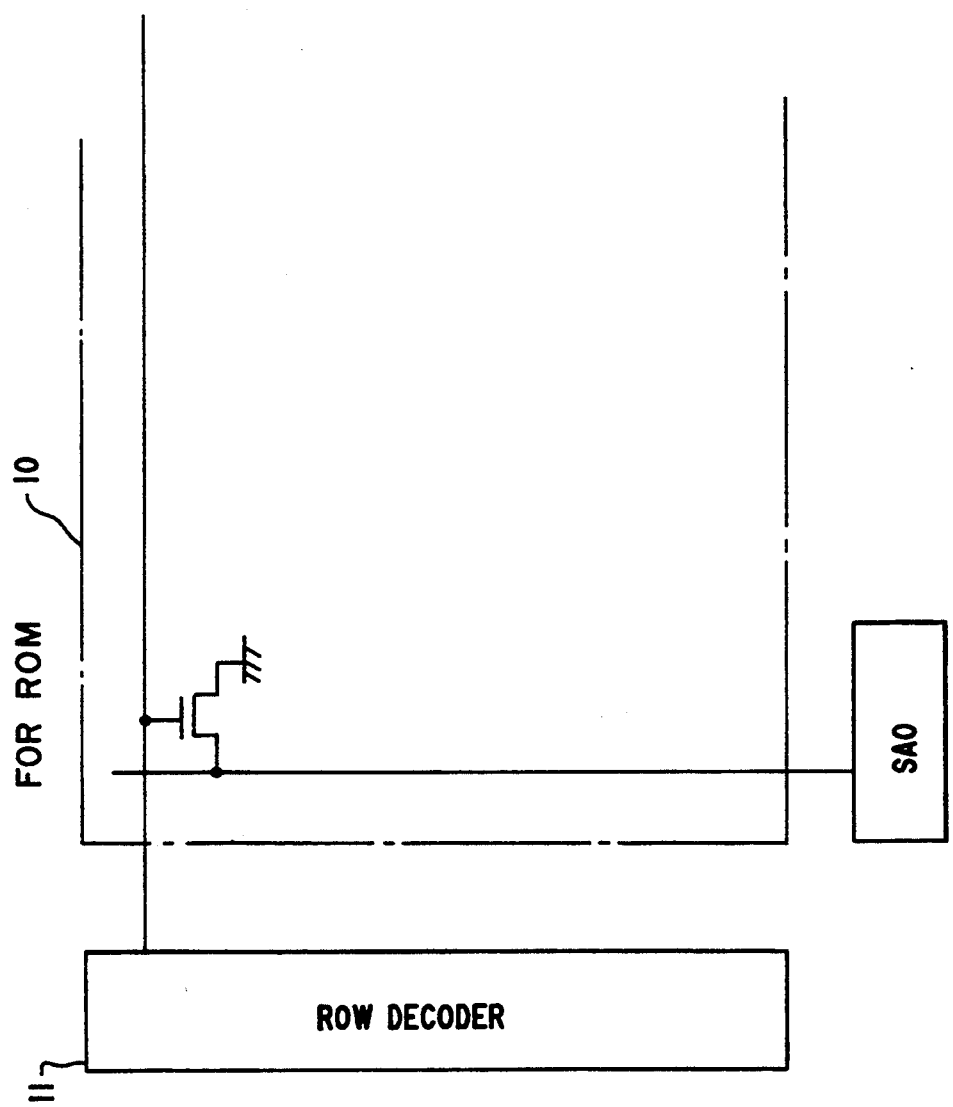
FIG. 6c shows a ROM and FIG. 6d shows a static RAM.
Figure 6D:
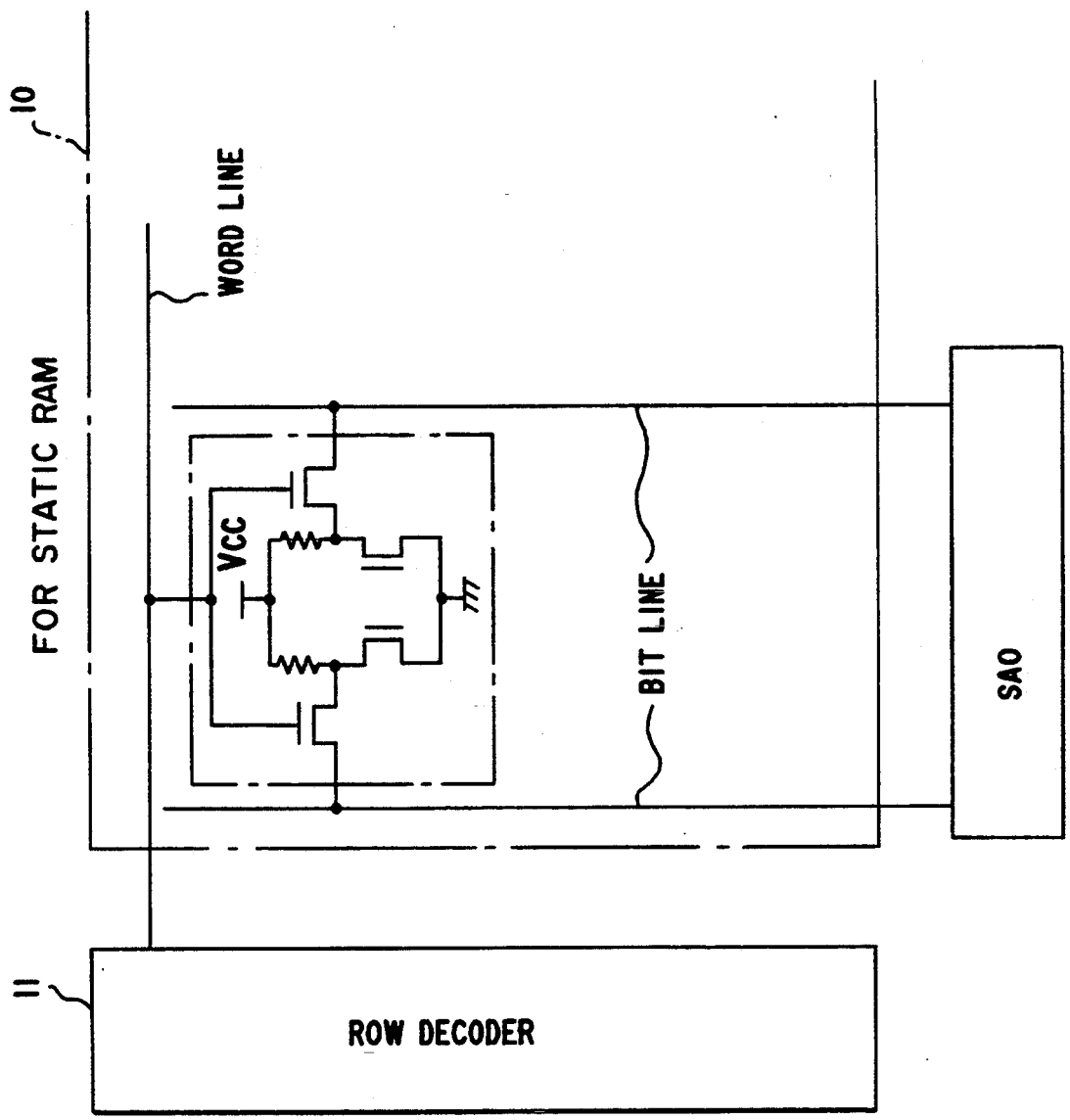

Referring to FIGS. 6a and 6b, a specific embodiment the semiconductor memory device shown in FIG. 2 will be described while FIG. 6c and 6d show the semiconductor memory device using a ROM and a static RAM.

The memory device includes the memory cell array 10, row decoder 11, and a sense amplifier circuit 13 including 64 sense amplifiers $SA_0$ to $SA_{63}$. The memory device may further include the static column register 12 including 64 latch circuits and the selection circuit 14. The selection circuit 14 includes a direction decoder 14a, and a plurality of column decoders including first and second X decoders 14b and 14c, first and second Y decoders 14d and 14e, and first and second Z decoders 14f and 14g. The decoders 14b, 14d, and 14f select a group of bit lines using select lines $l_1-l_4$ and the decoders 14c, 14e, and 14g select a subgroup of those bit lines using select lines $L_1-L_8$. The selection circuit 14 further includes first to eighth X selection gate circuits $14X_1$ to $14X_8$, first to eighth Y selection gate circuits $14Y_1$ to $14Y_8$, and first to eighth Z selection gate circuits $14Z_1$ to $14Z_8$. The memory device also includes a data bus 20.

The X selection gate circuits $14X_1$ to $14X_8$ include 64 transfer gates $TG_0$ to $TG_{63}$. The arrangement of eight transfer gates in each X selection gate circuit is the same, and is formed to output a pair of data as shown in FIG. 5b and Table 1. Each X selection gate circuit, for example, $14X_1$ also includes a multiplex gate circuit $MG_1$ formed by two parallel-connected transistors. The Y selection gate circuits $14Y_1$ to $14Y_8$ and the Z selection gate circuits $14Z_1$ to $14Z_8$ are similarly formed to meet the relationship shown in FIGS. 5d and 5f.

The row decoder 11 receives a row address of $RA_0$ to $RA_7$ and selects a corresponding word line in the memory cell array 10, outputting 64 bits of data on the bit lines. The 64 bits of data on the bit lines are amplified at the sense amplifiers $SA_0$ to $SA_{63}$ and stored in the latch circuits $SC_0$ to $SC_{63}$ of the column register 14. The direction decoder 14a receives a direction address of $DA_1$ and $DA_0$ as the direction signal SDIR in FIG. 2 and outputs an enable signal. When the direction address $DA_1$ and $DA_0$ is "00", the enable signal for energizing the X decoders 14b and 14c is output. Similarly, when the direction address $DA_1$ and $DA_0$ is "01", the enable signal for energizing the Y decoders 14d and 14e is output. When the direction address $DA_1$ and $DA_0$ is "11", the enable signal for energizing the Z decoders 14f and 14g is output. A lower column address $CA_1$ and $CA_0$ is supplied to the first X, Y, and Z decoders 14b, 14d, and 14f. One of these decoders 14b, 14d, and 14f, energized by the enable signal from the direction decoder 14a, outputs a gate control signal to one of lines $l_1$ to $l_4$. Namely, for example, when the lower column address $CA_1$ and $CA_0$ is "00" the gate control signal is output to the line $l_1$. An upper column address $CA_4$ to $CA_2$ is supplied to the second X, Y and Z decoders 14c, 14e, and 14g. One of these decoders 14c, 14e, and 14g, energized by the enable signal, outputs a multiplex control signal to one of lines $L_1$ to $L_8$. When the direction address $DA_1$ and $DA_0$ is "00" the lower column address $CA_1$ and $CA_0$ is "00" and the upper column address $CA_4$ to $CA_2$ is "000" the image data stored in the latch circuits $SC_0$ and $SC_1$ are output to the data bus 20 through the transfer gates $TG_0$ and $TG_1$ and the multiplex gate circuit $MG_1$ in the X selection gate circuit $14X_X$, as shown in FIG. 5c. Similarly, a pair of image data in an arbitrary direction, defined by the three dimensional relationship as shown in FIGS. 5a to 5g, can be arbitrarily read from the semiconductor memory device.

The above principle can be applied not only to the DRAM as shown but also to a static RAM and a ROM.

Another embodiment will be described with reference to FIGS. 7a to 7d.

In FIG. 7a, a single global word consists of a cubic-arranged three dimensional data of $8\times8\times8$ bits=512 bits. When the memory device shown in FIG. 2 is applied to handle the data shown in FIG. 7a, the global word of 512 bits can be read from the memory cell array 10 and stored in the column register 12 having 512 latch circuits through 512 sense amplifiers (not shown in FIG. 2). Eight image data in an arbitrary direction of the X, Y, and Z directions can be simultaneously output from the selection circuit 14, as shown in FIGS. 7b to 7d. FIG. 7b shows a data arrangement of eight image data in the X direction, and FIGS. 7c and 7d show data arrangements in the Y and Z directions.

Still another embodiment will be described with reference to FIGS. 8a to 8d.

Figure 16:
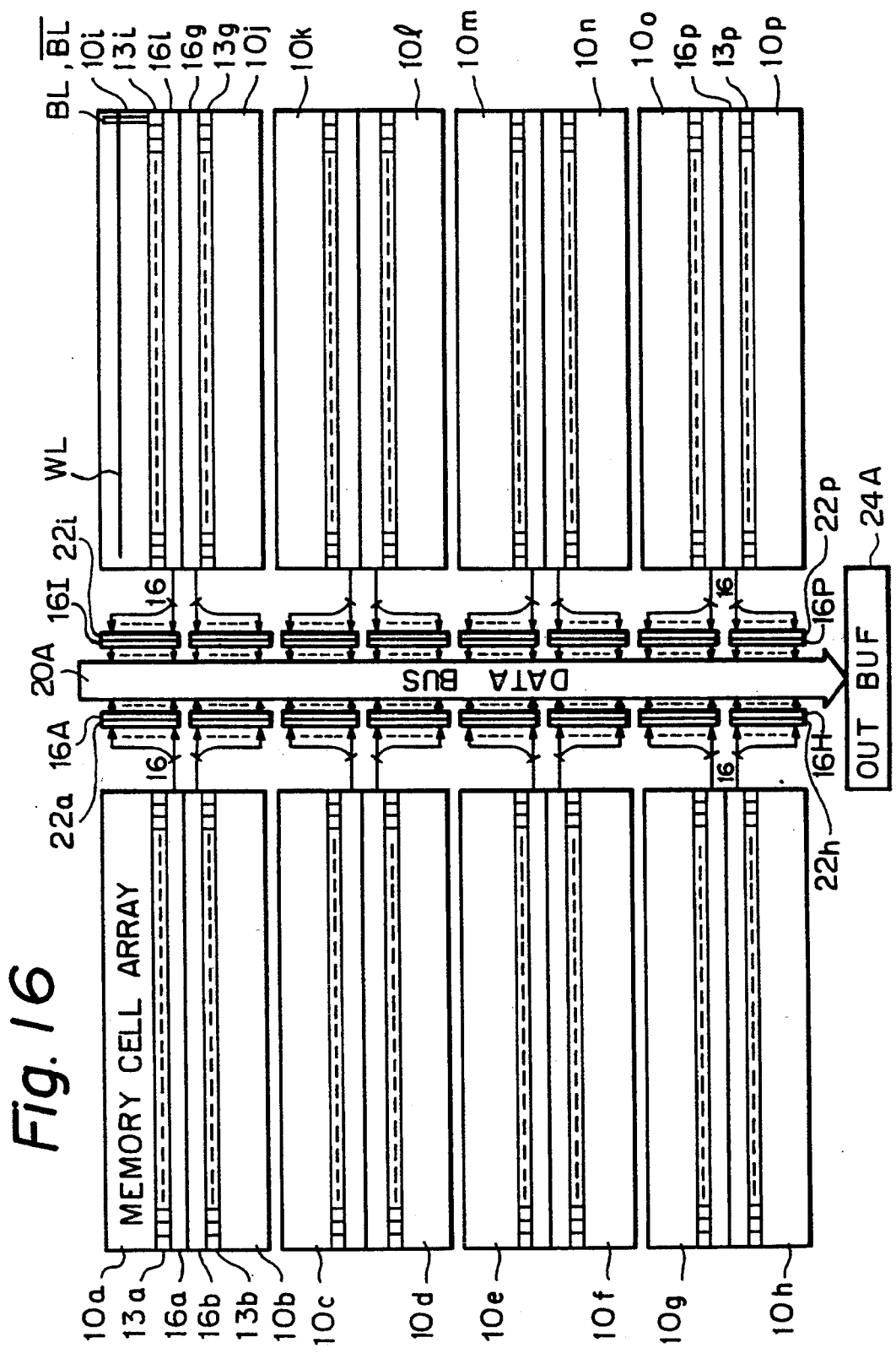
FIG. 16 is a block diagram of still another embodiment of a semiconductor memory device according to the present invention.

In FIG. 8a, a single global word consists of $16\times16$ plane-arranged data, each data consisting of 1 bits. The data of $16\times16\times1$ bits is read from the memory cell array 10 and stored in the column register 12. By selecting the direction, either 16 data in the X direction as shown it. FIG. 8b, 16 data in the Y direction as shown in FIG. 8c, or $4\times4$ data in a plane form as shown in FIG. 8d, can be read from the selection circuit 14. In this case the plane data array of $4\times4$ bits can be read simultaneously.

The above embodiments may be summarized as follows:

a) The provision of a memory cell means which enables a simultaneous read or write of a plurality of data bits forming multidimensional data in response to an access request, and b) The provision of a data selection means in, for example, a DRAM device, between bit lines and a data bus.

Upon a selection of a word liner all data in memory cells connected to the word line are output on the bit lines. The selection means receives the output data on the bit lines and outputs desired data therein in response to a selection signal designating one or more dimensions. One or more of the data busses can be provided in response to a request for simultaneous data selection.

Another embodiment of a semiconductor memory device of the present invention will be described with reference to FIG. 9. The memory device is formed to select the data arrangement shown in FIGS. 8a to 8d.

Figure 9:
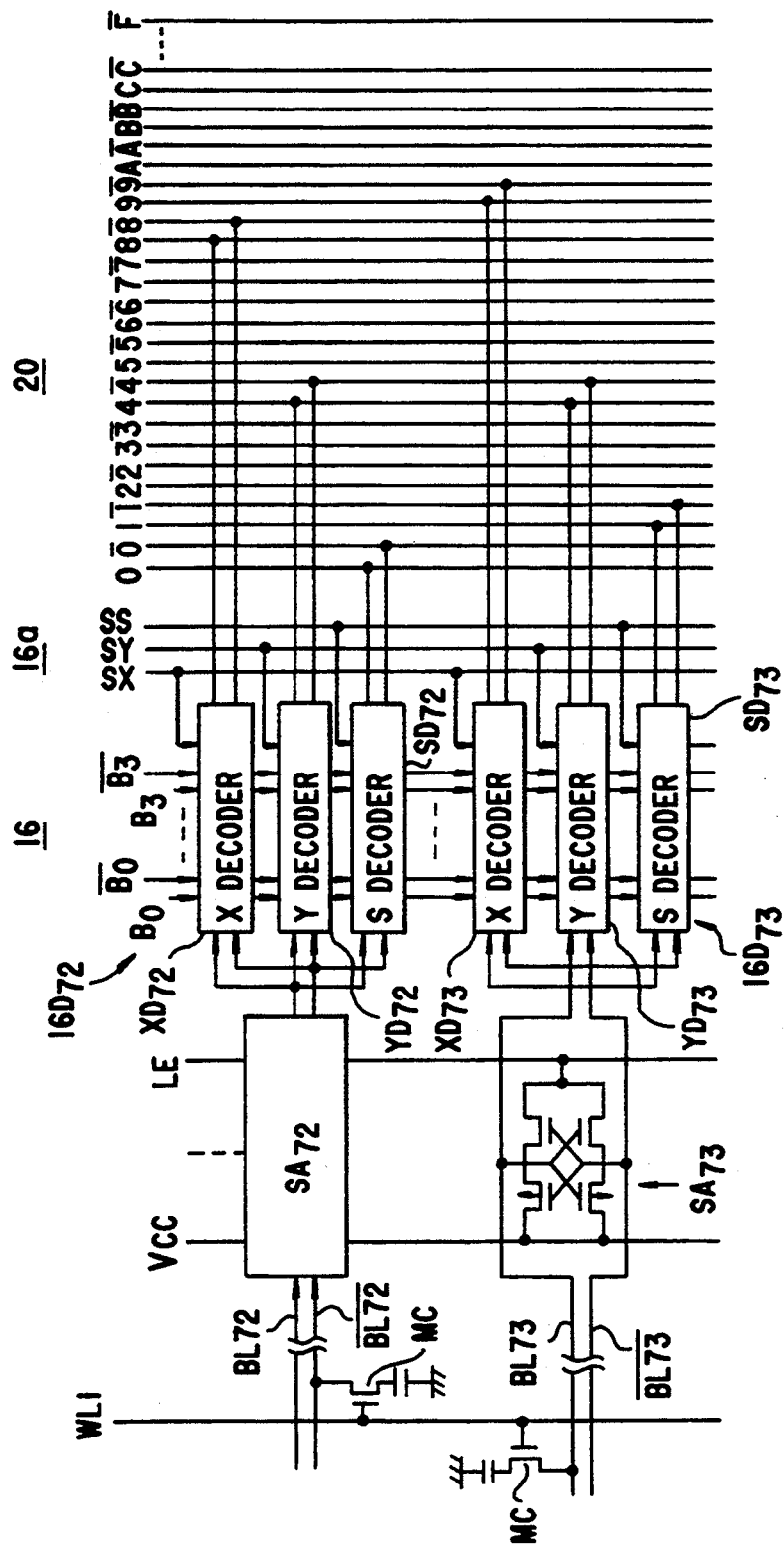
FIG. 9 is a circuit diagram of another selection circuit of the memory device shown in FIG. 2.

In FIG. 9, reference $WL_i$ denotes the i-th word line connected to 256 memory cells (MCs), BL72 and BL72 denote a pair of 72-th bit lines, $SA_{72}$ denotes a 72-th sense amplifier, a detailed circuit construction of which is shown for a 73-th sense amplifier $SA_{73}$, 16 denotes a selection circuit 16, and 20 denotes a data bus for outputting two bites i.e., 16 bits. The selection circuit 16 consists of 256 decoders for selecting directions, but only the 72-th and 73-th direction decoders $16D_{72}$ and $16D_{73}$, and direction control lines 16a are shown. Each direction decoder, for example $16D_{72}$, consists of an X decoder $XD_{72}$, a Y decoder $YD_{72}$, and an S decoder $SD_{72}$. Each direction decoder commonly receives a segment address of $B_0$ and $B_0$ to $B_3$ and $B_3$. One of the direction control lines 16a brings the corresponding direction decoder $XD_0$ to $XD_{255}$, $YD_0$ to $YD_{255}$, or $SD_0$ to $SD_{255}$ to an active state.

As shown in FIG. 8a, the 72-th sense amplifier $SA_{72}$ outputs a data bit of the ninth bit in the X direction (X=8) on the fifth row in the Y direction (Y=4). The 73-th sense amplifier $SA_{73}$ outputs the tenth bit in the X direction (X=9) on Y=4. When the segment address of $B_3$ and $B_3$ to $B_0$ and $B_0$ indicates Y=4 and the X decoder $SD_{72}$ is energized, the data of the sense amplifier $SA_{72}$ is output to a pair of data buses DB8 and DB8 through the X direction decoder $XD_{72}$. Similarly, the data of the sense amplifier $SA_{73}$ is output to a pair of data buses DB9 and DB9 through the X direction decoder $XD_{73}$. As a result, the 64-th to 79-th data bits are simultaneously output to the data bus 20, as shown in FIG. 8b.

Alternatively, the 72-th sense amplifier $SA_{72}$ outputs a data of the fifth bit in the Y direction (Y=4) on the ninth row in the X direction (X=8). When the segment address of $B_3$ and $B_3$ to $B_0$ and $B_0$ is eight (X=8) and the Y decoder $YD_{72}$ is energized, the data of the sense amplifier $SA_{72}$ is output to a pair of data buses DB4 and DB4 through the Y decoder $YD_{72}$. On the other hand, when the segment address of $B_3$ and $B_3$ to $B_0$ and $B_0$ is nine (X=9) and the Y decoder $YD_{73}$ is energized, the data of the sense amplifier $SA_{73}$ is output to the pair of data buses DB4 and DB4 through the Y decoder $YD_{73}$. Similarly, 16 bit data in the Y direction can be simultaneously output, as shown in FIG. 8c.

The above data selection can be applied to the selection on the S plane (direction) of $4\times4$ bits as shown in FIG. 8d.

In other words, the direction decoder, for example, $16D_{72}$ consisting of the X, Y, and S decoders $XD_{72}$, $YD_{72}$ and $SD_{72}$, the direction control lines 16a, and the data bus 20 are connected to output 16 bit data in any direction, i.e., X direction, Y direction, or S plane.

Figure 10:
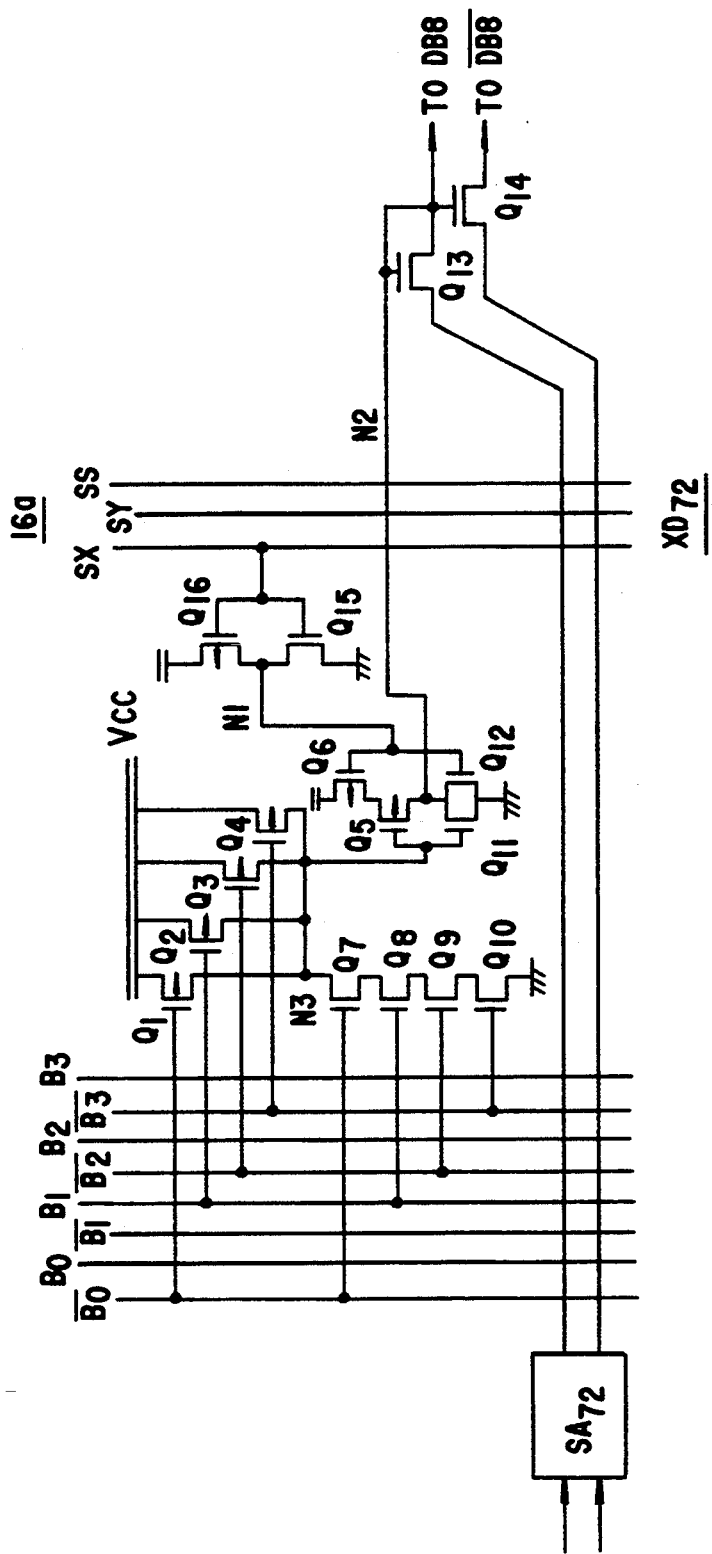
FIG. 10 is a circuit diagram of a decoder shown in FIG. 9.

FIG. 10 is a circuit diagram of the X decoder $SD_{72}$. References $Q_1$ to $Q_6$ and $Q_{16}$ denote p-channel MOS transistors, and $Q_7$ to $Q_{15}$ denote n-channel MOS transistors. When the X line of the direction control lines 16a is at a high level, the transistor $Q_{16}$ is turned ON but the transistor $Q_{15}$ is turned OFF, and thus a node N1 is low at a level. The transistor $Q_{12}$ is turned OFF but the transistor $Q_6$ is turned ON. When the segment address of $B_3$ and $B_3$ to $B_0$ and $B_0$ is "0100" and selects the X decoder $XD_{72}$, a decoding portion formed by the parallel-connected transistors $Q_1$ to $Q_4$ and the series-connected transistors $Q_7$ to $Q_{10}$ becomes effective, making a node N3 a low level. The transistor $Q_5$ is turned ON and the transistor $0_{11}$ is turned OFF making a node N2 a high level. As a result, the transfer gate transistors $Q_{13}$ and $Q_{14}$ are turned ON, outputting the data from the sense simplifier $SA_{72}$ to the data buses DB8 and DB8.

In FIG. 9, the direction decoder, for example, $16D_{72}$, consisting of three decoders $XD_{72}$, $YD_{72}$, and $SD_{72}$ must be provided for each sense amplifier. Generally, $N^a$ is the number of memory cells connected to a word line, where N is the number of simultaneous selection bits data and a is the number of directions of the logical bit map space, and the simultaneous selection for N bits in k dimensions (or directions) is required, the direction decoders of $kN^a$ and selection signal lines, connecting between the decoders and the data buses, of $(2 \cdot \log_2 N^{2-1} + K)$ must be provided. These cause a complex circuit construction. In addition, since a distance between the adjacent bit lines in the cell array is narrow, the provision of the decoders of k in the distance is actually impossible. As a result, the distance must expanded, resulting in a low integration of the semiconductor memory device.

A circuit shown in FIG. 11 is intended to solve the above defects. In FIG. 11, a predecoder circuit 18 consisting of an X predecoder $18_x$, a Y predecoder $18_y$, and an S predecoder $18_s$, X selection lines $30_x$, Y selection lines $30_y$, S selection lines $30_s$, and transfer gates $72_x$, $72_y$, $72_s$, $73_x$, $73_y$ and $73_s$, are provided between the sense amplifiers $SA_{72}$ and $SA_{73}$ and the data bus 20. The transfer gate $72_x$ corresponds to the transistors $Q_{13}$ and $Q_{14}$ in FIG. 10. One of the predecoders $18_x$, $18_y$, and $18_s$ is energized by one of the direction control signals SX, SY, and SS in an active state. The energized predecoder outputs a high level signal to a line in the selection lines $30_x$, $30_y$ or $30_s$ in response to the segment address of $B_3$ and $B_3$ to $B_0$ and $\overline{B_0}$ and energizes the transfer gate connected to the line, outputting the data of the sense amplifier to the data bus 20. An output "0" of the X predecoder $18_x$ selects a 0-th segment. The data of the 0-th segment in the X direction are output from the sense amplifiers $SA_0$ to $SA_{15}$ (not shown). Transfer gates $00_x$ to $15_x$ (not shown) pass the data from the sense amplifiers $SA_0$ to $SA_{15}$ to pairs of the data buses DB0 and $\overline{DB0}$ to DBF and $\overline{DBF}$.

In more detail, as shown in FIG. 11, when the X predecoder $18_x$ is energized by the direction control signal SX and the segment address $B_3$ and $\overline{B_3}$ to $B_0$ and $\overline{B_0}$ is four ("0100"), the X predecoder $18_x$ makes a fifth output ("4") high level. The transfer gate $72_x$ is turned ON, passing the data of the sense amplifier $SA_{72}$ to the pair of data buses DB8 and $\overline{DB8}$. Alternatively, the Y predecoder $18_y$ is energized and the segment address of $B_3$ and $\overline{B_3}$ to $B_0$ and $\overline{B_0}$ is eight ("1000"), the Y predecoder $18_y$ outputs the data of the sense amplifier $SA_{72}$ to a pair of data buses DB4 and $\overline{DB4}$ through the transfer gate $72_y$.

Figure 12A:
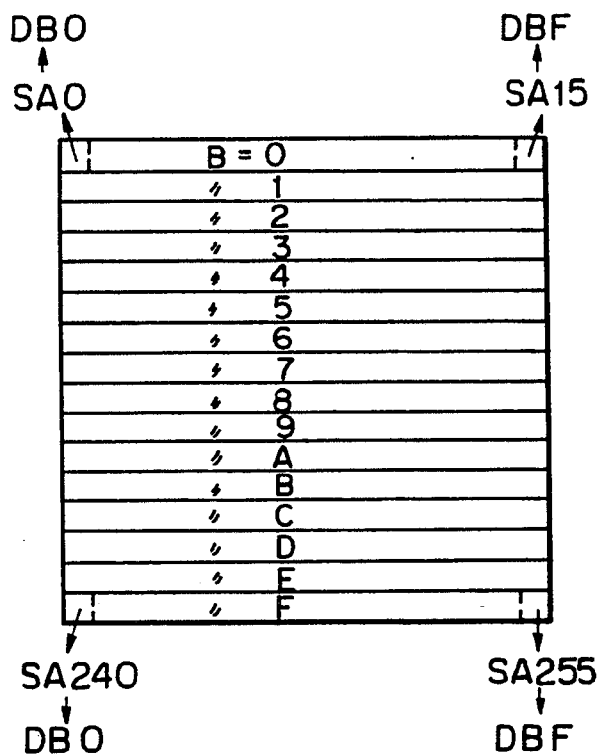
FIGS. 12a to 12d are views representing the relationships between the segments in the X, Y, and S directions and the sense amplifiers.

The relationship between the X selection lines $30_x$ of hexadecimal numbered "0" to "F" (sixteen) lines, the data bus 20 consisting of 16 pairs of data buses also hexadecimal numbered "0" and "$\overline{0}$" to "F" and "$\overline{F}$", and the sense amplifiers $SA_0$ to $SA_{255}$, is defined as shown in Table 2. In Table 2, the segment corresponds to the X selection lines $30_x$, because each line designates a segment of 16 bits. The above relationship is also represented in FIGS. 12a, and 12d. In FIG. 12a, reference B indicates the segment address of $B_3$ and $\overline{B_3}$ to $B_0$ and $\overline{B_0}$.

TABLE 2

| SEGMENT | DATA BUS PAIR/SENSE AMPLIFIER | | | | |
|---|---|---|---|---|---|
| 0 | 0 | 1 | ... | "E" | "F" |
|   | $SA_0$ | $SA_1$ | ... | $SA_{14}$ | $SA_{15}$ |
| 1 | 0 | 1 | ... | "E" | "F" |
|   | $SA_{16}$ | $SA_{17}$ | ... | $SA_{30}$ | $SA_{31}$ |
| . | . | . | ... | . | . |
| . | . | . |     | . | . |
| . | . | . |     | . | . |
| F | 0 | 1 | ... | "E" | "F" |
|   | $SA_{240}$ | $SA_{241}$ | ... | $SA_{254}$ | $SA_{255}$ |

Figure 12B:
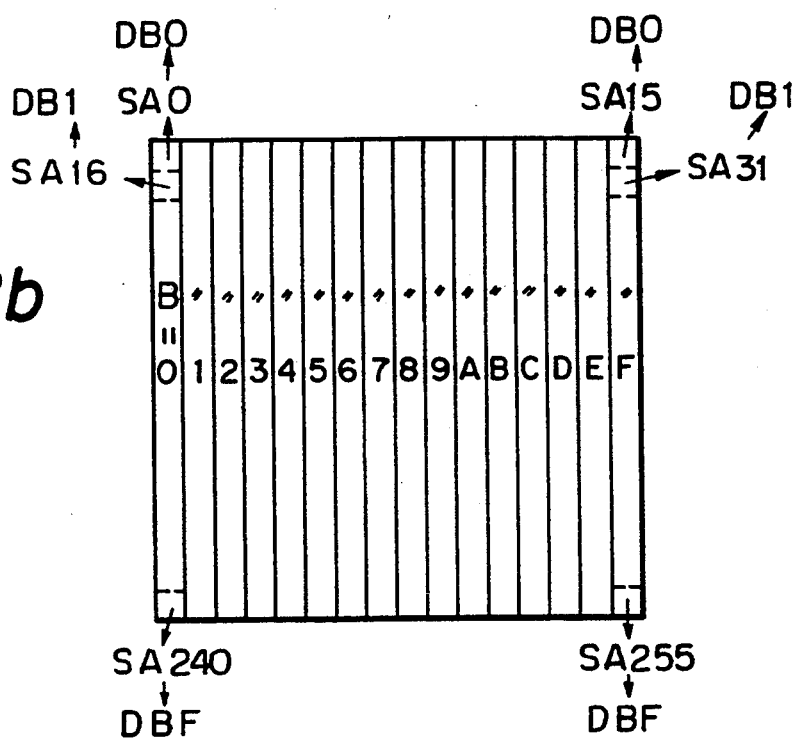
Figures 12C, 12D:
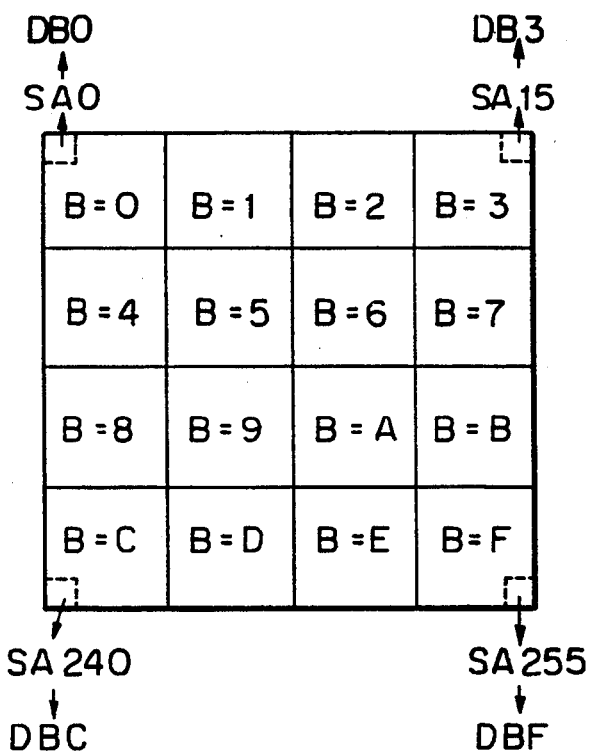

The relationship between the Y selection lines $30_y$, the data bus 20, and the sense amplifiers is also defined as shown in Table 3 and FIGS. 12b and 12d.

TABLE 3

| SEGMENT | 0 | | 1 | | ... | "F" | |
|---|---|---|---|---|---|---|---|
| DATA BUS PAIR / SENSE AMPLIFIER | 0 | $SA_0$ | 0 | $SA_{16}$ | ... | 0 | $SA_{15}$ |
|  | 1 | $SA_{16}$ | 1 | $SA_{17}$ | ... | 1 | $SA_{31}$ |
|  | . | . | . | . | ... | . | . |
|  | . | . | . | . |     | . | . |
|  | "F" | $SA_{240}$ | "F" | $SA_{241}$ | ... | "F" | $SA_{255}$ |

Similarly, the relationship between the S selection lines $30_s$, the data bus 20, and the sense amplifiers is defined as shown in Tables 4-1 to 4-4, as typical examples, and FIGS. 12c and 12d.

TABLE 4-1

SEGMENT = 0

DATA BUS PAIR / SENSE AMPLIFIER

| 0 | 1 | 2 | 3 |
|---|---|---|---|
| $SA_0$ | $SA_1$ | $SA_2$ | $SA_3$ |
| 4 | 5 | 6 | 7 |
| $SA_{16}$ | $SA_{17}$ | $SA_{18}$ | $SA_{19}$ |
| 8 | 9 | "A" | "B" |
| $SA_{32}$ | $SA_{33}$ | $SA_{34}$ | $SA_{35}$ |
| "C" | "D" | "E" | "F" |
| $SA_{48}$ | $SA_{49}$ | $SA_{50}$ | $SA_{51}$ |

TABLE 4-2

SEGMENT = 3

DATA BUS PAIR / SENSE AMPLIFIER

| 0 | 1 | 2 | 3 |
|---|---|---|---|
| $SA_{12}$ | $SA_{13}$ | $SA_{14}$ | $SA_{15}$ |
| 4 | 5 | 6 | 7 |
| $SA_{28}$ | $SA_{29}$ | $SA_{30}$ | $SA_{31}$ |
| 8 | 9 | "A" | "B" |
| $SA_{44}$ | $SA_{45}$ | $SA_{46}$ | $SA_{47}$ |
| "C" | "D" | "E" | "F" |
| $SA_{60}$ | $SA_{61}$ | $SA_{62}$ | $SA_{63}$ |

TABLE 4-3

SEGMENT = "C"

| DATA BUS PAIR | | | |
|---|---|---|---|
| SENSE AMPLIFIER | | | |
| 0 | 1 | 2 | 3 |
| $SA_{192}$ | $SA_{193}$ | $SA_{194}$ | $SA_{195}$ |
| 4 | 5 | 6 | 7 |
| $SA_{208}$ | $SA_{209}$ | $SA_{210}$ | $SA_{211}$ |
| 8 | 9 | "A" | "B" |
| $SA_{224}$ | $SA_{225}$ | $SA_{226}$ | $SA_{227}$ |
| "C" | "D" | "E" | "F" |
| $SA_{240}$ | $SA_{241}$ | $SA_{242}$ | $SA_{243}$ |

TABLE 4-4

SEGMENT = "F"

| DATA BUS PAIR | | | |
|---|---|---|---|
| SENSE AMPLIFIER | | | |
| 0 | 1 | 2 | 3 |
| $SA_{204}$ | $SA_{205}$ | $SA_{206}$ | $SA_{207}$ |
| 4 | 5 | 6 | 7 |
| $SA_{220}$ | $SA_{221}$ | $SA_{222}$ | $SA_{223}$ |
| 8 | 9 | "A" | "B" |
| $SA_{236}$ | $SA_{237}$ | $SA_{238}$ | $SA_{239}$ |
| "C" | "D" | "E" | "F" |
| $SA_{252}$ | $SA_{253}$ | $SA_{254}$ | $SA_{255}$ |

Figure 13:
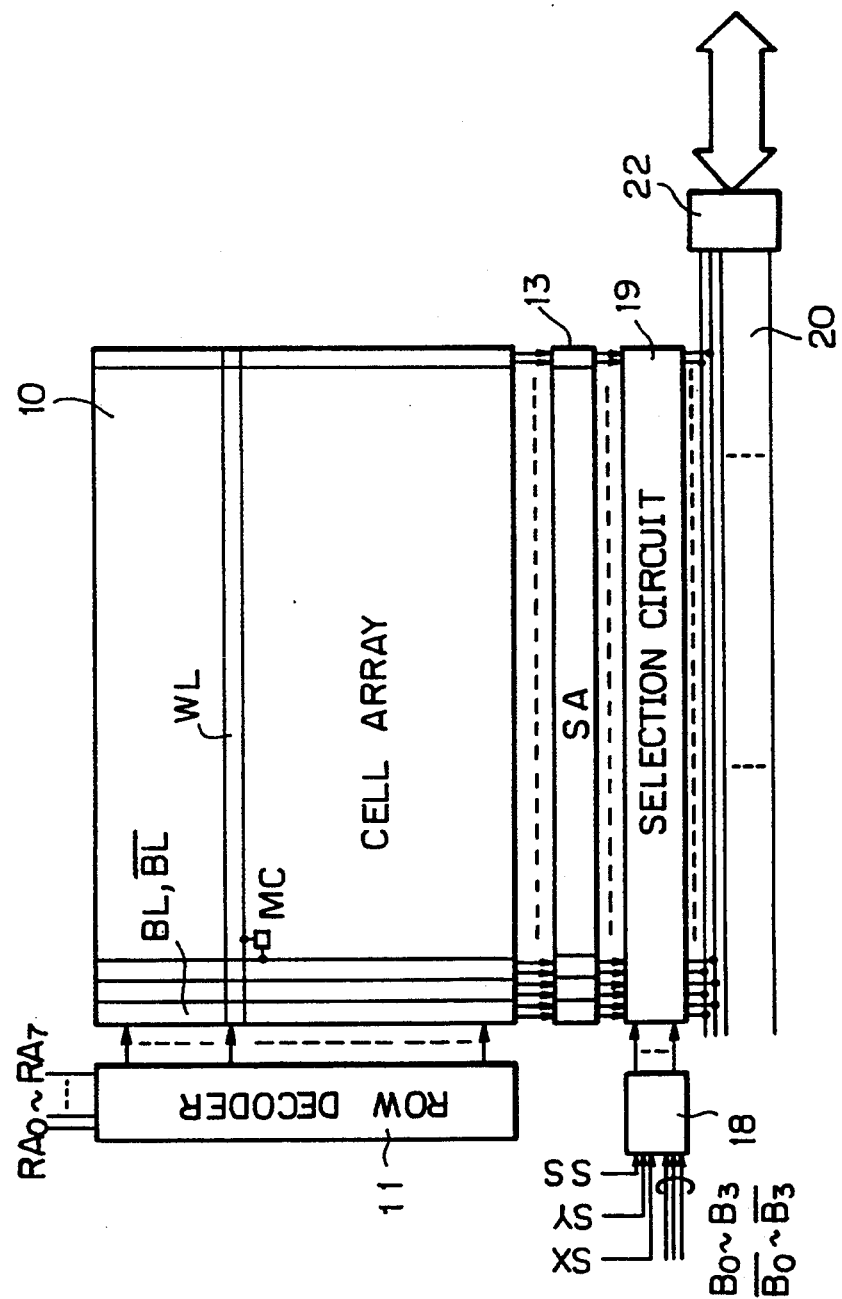
FIG. 13 is a block diagram of the memory device shown in FIG. 11.

FIG. 13 is a block diagram of the memory device shown in FIG. 11. The memory device includes the memory cell array 10 of 256 pairs of bit lines×256 word lines, the row decoder 11, the sense amplifier circuit 13 consisting of 256 sense amplifiers, the predecoder circuit 18 consisting of the X predecoder $18_x$, the Y predecoder $18_y$, and the S predecoder $18_s$, a multidirectional selection circuit 19 including the transfer gates and the X selection lines $30_x$, the Y selection lines $30_y$ and the S selection lines $30_s$, and the data bus 20. The memory device also includes a latch circuit 22 holding a selected 16 bits of data.

Compared with the memory device shown in FIG. 9, the number of decoders in the memory device shown in FIG. 11 can be reduced to k. However, $kN^{a-1}$ of selection lines still must be provided.

Figures 14, 14A:
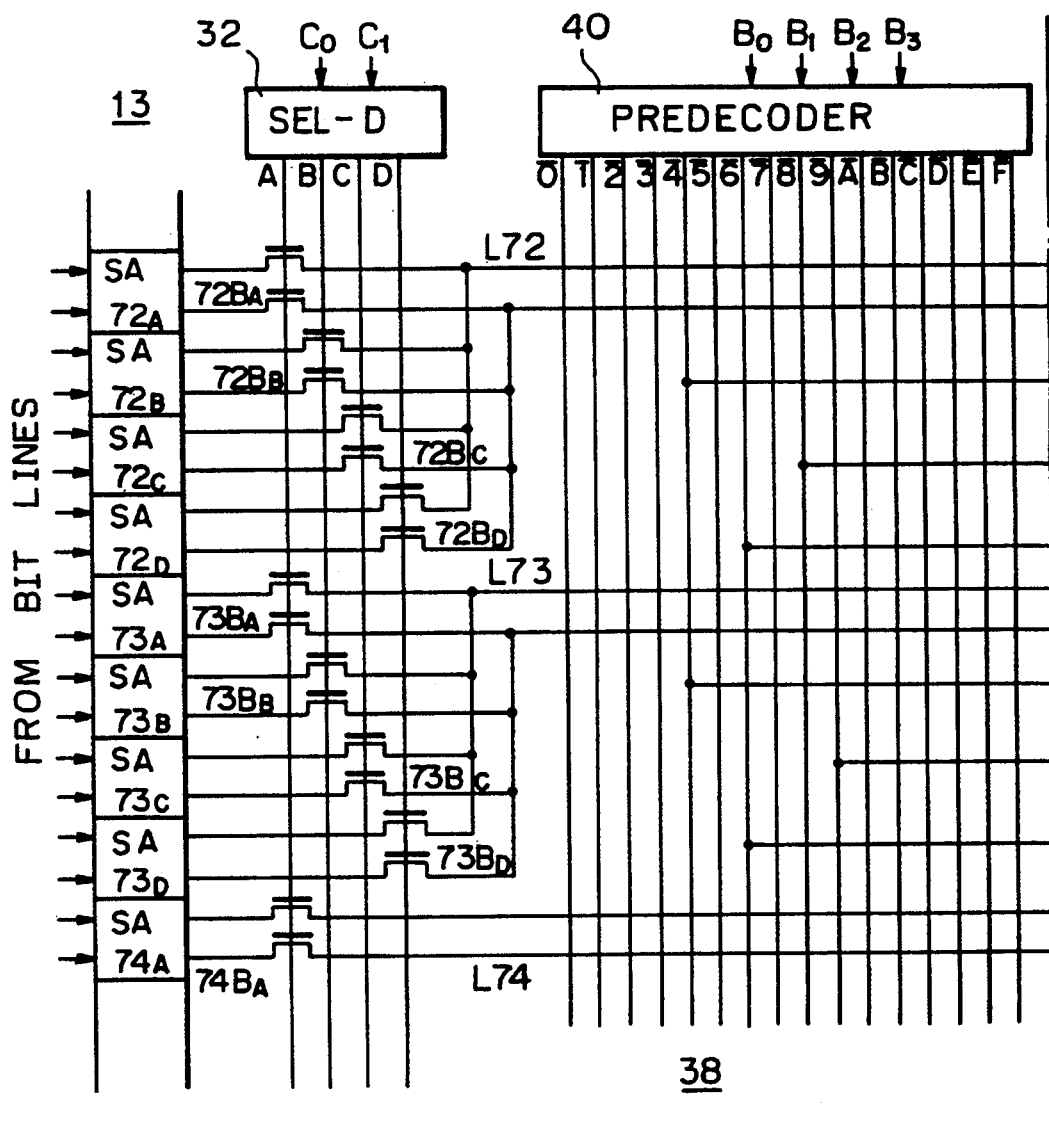
Figure 14:
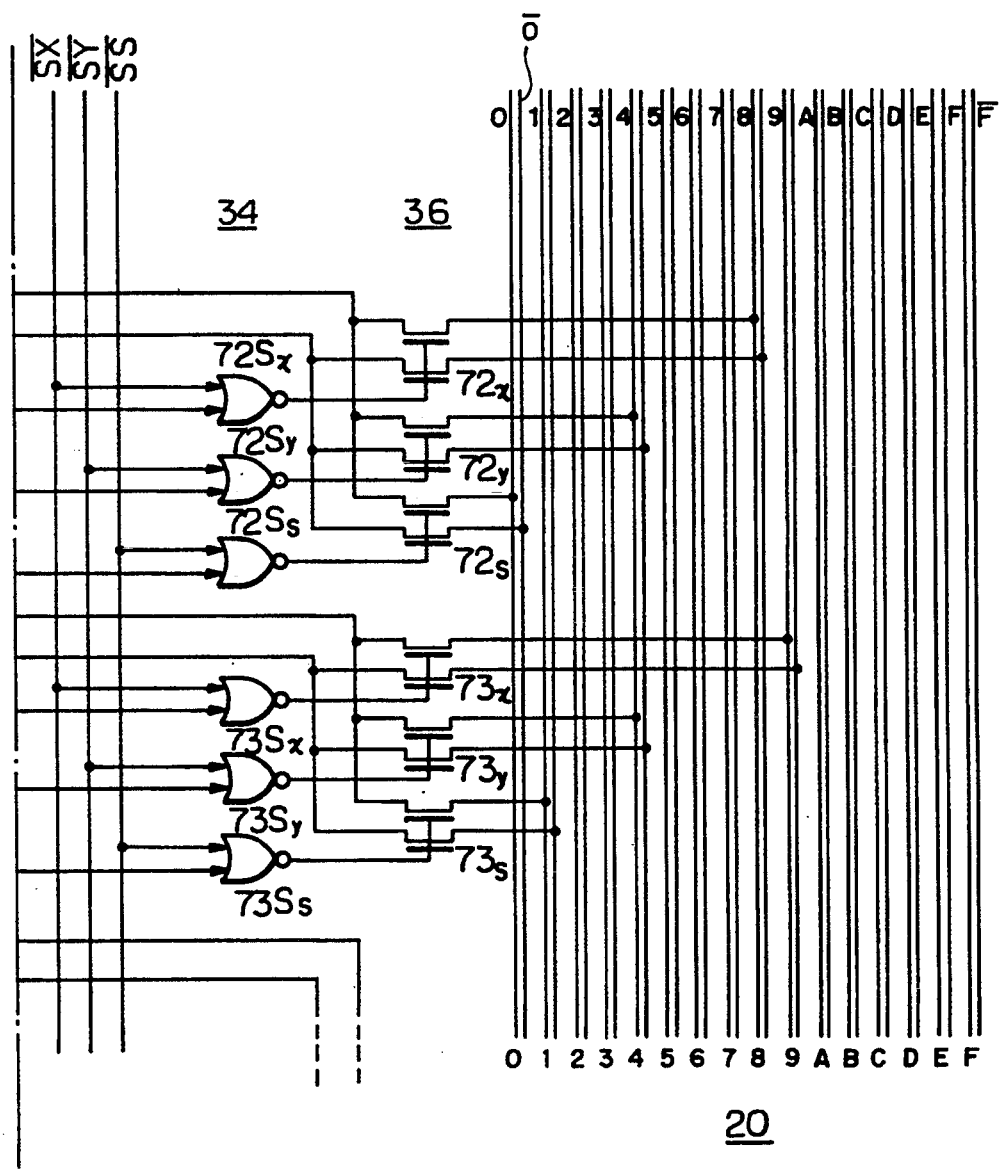

Referring to FIGS. 14, 14a and 14b, another embodiment of a semiconductor memory device of the present invention, which enables a further simplification of the circuit construction, will be described.

In FIGS. 14a and 14b, the memory device enables the selection of three directions of X, Y, and S and the simultaneously output of sixteen bits of data. The data bus 20 includes 16 pairs of data buses of DB0 and $\overline{DB0}$ to DBF and $\overline{DBF}$. A predecoder 40 is provided for commonly using all selection directions. An exclusive selection circuit 38 includes 16 lines. In order to select the direction, a direction selection gate circuit 34 consisting of 256 selection gate groups, each group including X, Y, and S selection gates, for example, $72S_X$, $72S_y$ and $72S_S$, and the transfer gate circuit 36 consisting of 256 transfer gate groups, each group including X, Y, and S transfer gates, for example, $72_x$, $72_y$ and $72_s$ similar to those in FIGS. 9 and 11, are provided. Each selection gate, for example, $72S_x$, is formed by an NOR gate. The 256×4=1024 bit lines are provided, discretely arranged in fours and connected to the sense amplifier circuit 13. The 0-th segment of 16 bits includes data for the 0-th, fourth, eighth, ..., 66-th bit lines. The 1-st (first) segment includes data on the 64-th, 68-th, 72-th, ..., 124-th bit lines. Four groups of 16×16 bits of data as shown in FIG. 8d are connected to one word line. The sense amplifier circuit. 13 includes 1024 sense amplifiers $SA0_A$, $SA0_B$, $SA0_C$, $SA0_D$, ..., $SA72_A$, $SA72_B$, $SA72_C$, $SA72_D$, ..., $SA255_A$, $SA255_B$, $SA255_C$, $SA255_D$. A bit selection decoder 32 and bit selection gates, for example, $72B_A$ to $72B_D$, select data from the sense amplifiers, for example, $SA72_A$ to $SA72_D$, and output the data to a pair of lines L72.

When a bit selection signal $C_1$ and $C_0$ is "00" the bit selection gates $72B_A$, $73B_A$ and $74B_A$ are turned on, outputting the data from the sense amplifiers $SA72_A$, $SA73_A$, $SA74_A$ to the lines L72, L73, and L74. The data to the sense amplifier $SA72_A$ is the data of fourth segment and eighth bit. When the segment address of $B_3$ and $B_3$ to $B_0$ and $B_0$ is four ("0100"), the predecoder 40 outputs a low level signal on an output of 4. When the X direction selection signal $\overline{SX}$ is low level, the data on the lines L72 is output to the pair of data buses DB8 and $\overline{DB8}$ through the transfer gate $72_x$.

By constructing the circuit as shown in FIGS. 14a and 14b, the selection circuits, for example, $72B_A$, $72S_x$, and $72_x$, can be provided in a pitch between the adjacent bit lines without expanding the pitch. On the other hand, by increasing the bit lines, a space in the memory cell array is obtained, and circuits for other groups can be provided in that space, and data from the circuits can be selected by the bit selection decoder 32. As a result, integration of the memory device as a whole can be greatly improved. In addition, compared with the decoder shown in FIG. 10, since the selection gate, for example, $72S_x$ is a NOR gate, the space required by the circuit is reduced to approximately one-thirds. The selection lines between the sense amplifier circuit 13 and the data bus 20 are also greatly reduced.

Instead of the bit selection gates, for example, $72B_A$ to $72B_D$, latch circuits can be provided. The bit decoder 32 selects the data from the latch circuits.

The arrangement shown in FIGS. 14a and 14b is optimized for the selection in the X direction, but the arrangement can be modified to optimize the selection in the Y direction, or the S plane.

In the circuit shown in FIGS. 14a and 14b, the circuits are operated at a low enable level, but can be modified to operate at a high enable level.

Figure 15:
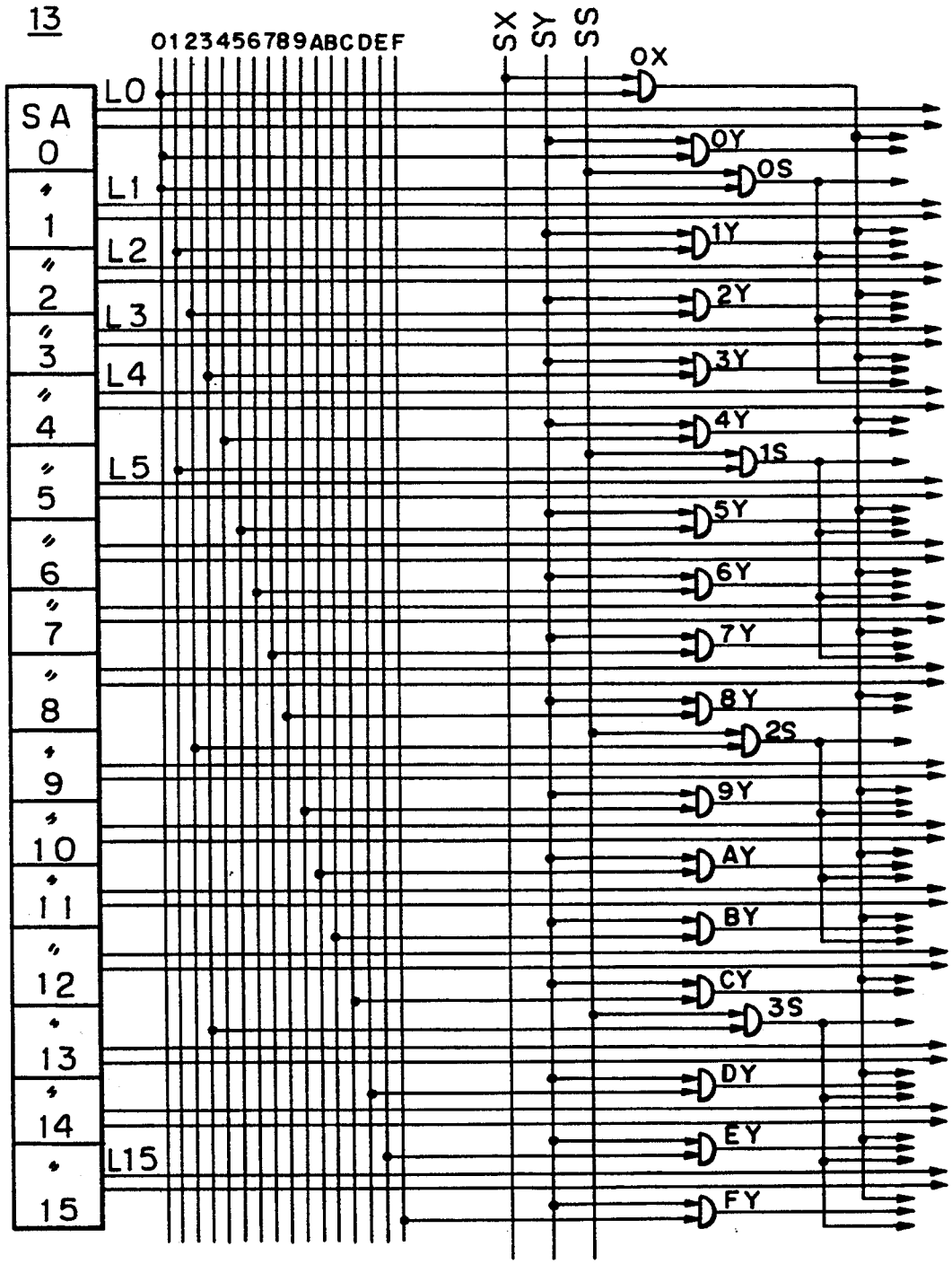
FIG. 15 is a circuit diagram of another selection circuit of the memory device shown in FIG. 13.

FIG. 15 is a circuit diagram of a semiconductor memory device modified from the memory device shown in FIGS. 14a and 14b.

The selection gates in the bit selection gate circuit 34 have the same inputs. For example, in FIGS. 14a and 14b, the gates $72S_x$ and $73S_x$ have the same inputs Also, the gates $72S_s$ and $73S_s$ have the same inputs. The circuit shown in FIG. 15 eliminates these redundancies and simplifies the circuit construction. When 16 bits of data in the X direction are sequentially arranged on the word line, inputs of a NOR gate from the sense amplifiers $SA_0$ to $SA_{15}$ become the same upon an output of "0" from the predecoder 40. As a result, the above operation can be achieved by a single gate. In FIG. 15, the circuits operate at a high enable level. Accordingly, the NOR gate in FIGS. 14a and 14b can be replaced by an AND gate, such as OX in FIG. 15. The AND gate OX can be commonly used for one segment of 16 bits. Since the plane selection gates have the same four inputs, a single AND gate, such as OS, can achieve the selection for one segment. However, Y selection gates do not have the same inputs, and thus must be provided independently as shown by OY, 1Y, ... FY. The sense amplifier SAf$_0$ represents the sense amplifiers SA0$_A$ to SA0$_D$. Lines LO correspond to the lines, for example, L72, operatively connected to the sense amplifiers SA72$_A$ to SA72$_D$. The transfer gates, for example, 72$_x$, 72$_y$ and 72$_s$, can be connected to the lines LO and triggered by outputs from the AND gates OX, OY, and OS. In FIG. 15, only an O-segment is shown.

When the bits of data in the Y direction are sequentially arranged at the word line, the number of gates for the Y direction can be reduced, but the gates for the X direction must be provided independently.

In the above embodiments, if the directions are increased and/or the bit length of one segment is expanded, the areas of the selection circuit 16, the decoder 18, etc., are greatly increased. Also, a drive current may be increased. In addition, an access time may become long. Furthermore, the total cost of the semiconductor memory device may be increased.

The following embodiments are intended to overcome the above defects when a high direction :a of the logical bit map space and a large bit length N of the segment and/or a large number of the access directions :k are required.

Referring to FIG. 16, a semiconductor memory device includes 16 memory cell arrays 10a to 10p, 16 sense amplifier circuit sets 13a to 13p each set consisting of 256 sense amplifiers, 16 first multidirection selection circuit sets 16a to 16p each set consisting of 256 selection circuits, 16 latch circuits 22a to 22p, a second multi-direction selection circuit incorporated with circuits 16A to 16P, first data buses 20a to 20p (not shown), a second (common) data bus 20A, and an output buffer 24A.

Each memory cell array is formed by a folded type DRAM and has a capacity of 256×256 bits. Accordingly, in each memory cell array, 256 pairs of bit lines BL$_0$ and $\overline{BL}_0$ to BL$_{255}$ and $\overline{BL}_{255}$ and 256 word lines WL$_0$ to W$_{255}$ are provided, and 256 memory cells (16×16) are connected to each word line. Each sense amplifier circuit, for example, 13a, consists of 256 sense amplifiers. One segment consists of 16 bits of data. A same row address RA$_0$ to RA$_7$ (not shown) is commonly applied to all memory cell arrays 10a to 10p. A first segment address of B$_0$ and $\overline{B}_0$ to B$_3$ and $\overline{B}_3$ (not shown) is commonly applied to the first multidirection selection circuits 16a to 16p. A second segment address of B$_4$ and $\overline{B}_4$ to B$_7$ to $\overline{B}_7$ (not shown) is commonly applied to the second multidirection selection circuit of 16A to 16P. Each first data bus, for example, 20a consists of 16 pairs of data buses DB0 and $\overline{DB0}$ to DBF and $\overline{DBF}$, but is illustrated only in outline. The second multidirection selection circuit, for example, 16A, receives 16 bits of data. The second multidirection selection circuit incorporated with the circuits 16A to 16P hold 16×16=256 bits. Accordingly, the second multidirection selection circuit of 16A to 16P can be selected in the same way as the selection of the first multidirection selection circuits 16a to 16p. Thus, 16 bits of data from a selected second multidirection selection circuit are output to the second data bus 20A. The data on the second data bus 20A is output to an external circuit (not shown) through the output buffer 24A.

First, in the first multidirection selection circuits, 16 bits of data within 16×16 bits in a logical bit map plane in any one of the X, Y, and S dimensions can be selected. Next, in the second multi-direction selection circuits, 16 bits of three dimensional data within 16×16×16 bits in a logical cubic bit map space can be selected. That is, a three direction data selection can be achieved.

Figure 17:
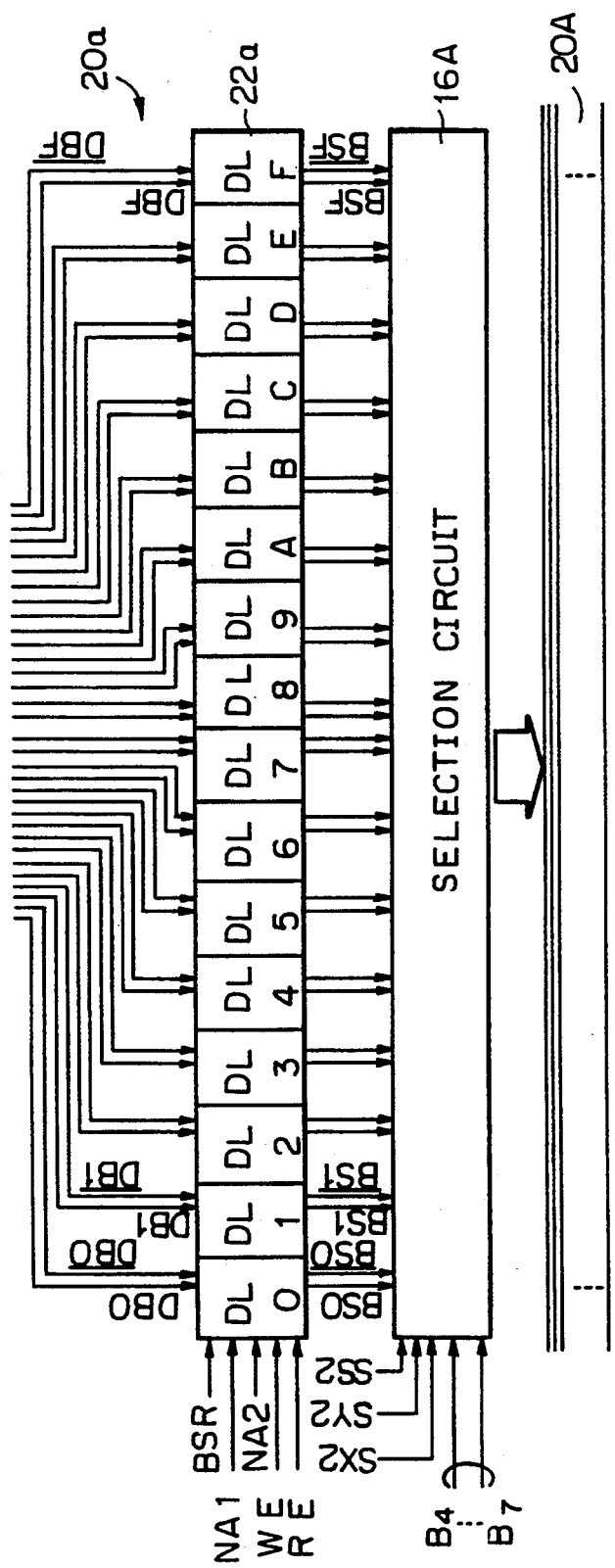
FIG. 17 is a circuit diagram of a part of the memory device shown in FIG. 16.

FIG. 17 shows the detailed connections between the first data bus 20a and the latch circuit 22a between the latch circuit and the second multidirection selection circuit 16A, and between the second multidirection selection circuit 16A and the second data bus 20A.

Figure 18:
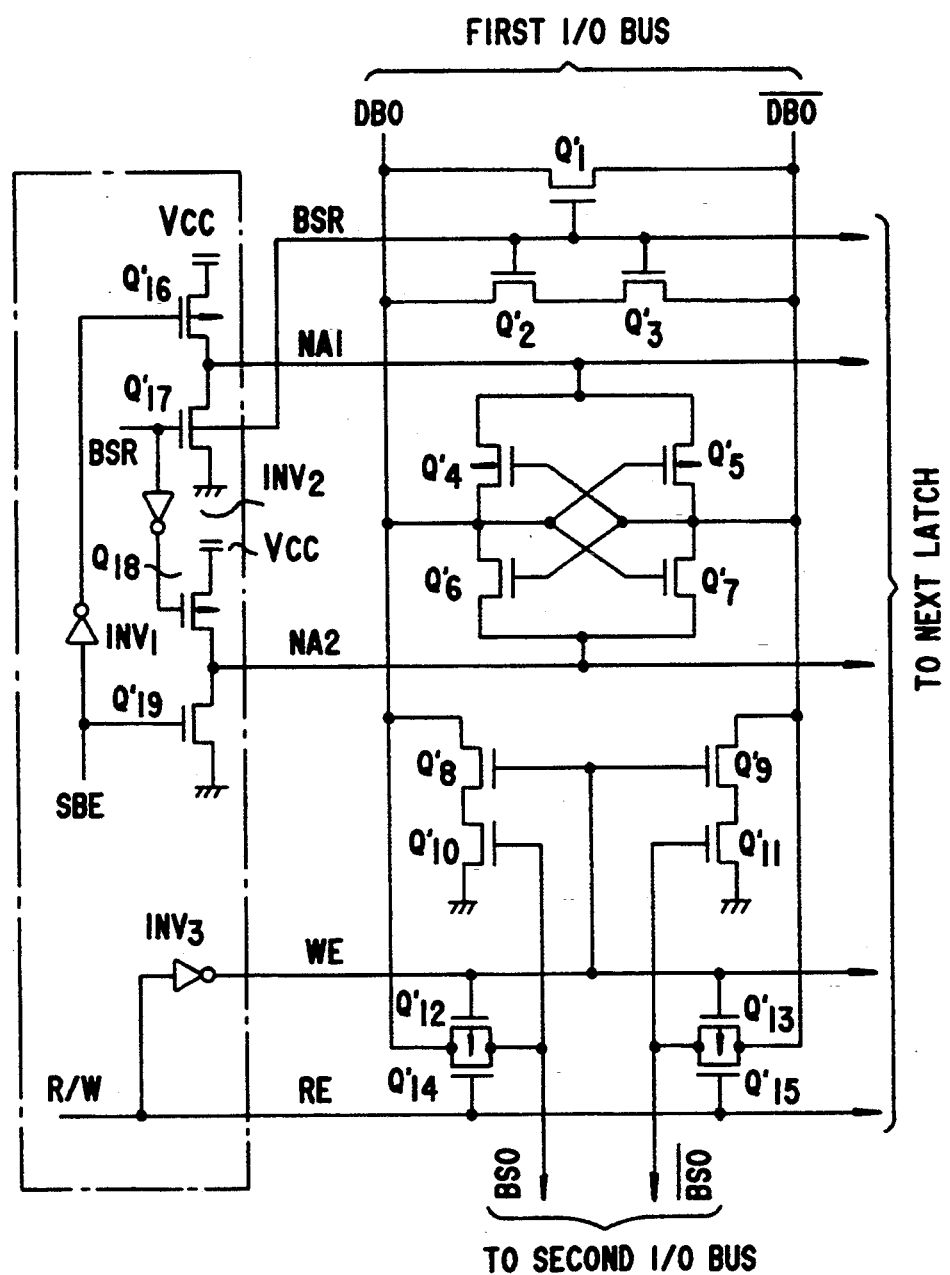
FIG. 18 is a circuit diagram of a latch circuit shown in FIG. 17.

In FIG. 18, a detailed latch circuit DLO comprises p-channel MOS transistors Q'$_4$, Q'$_5$, Q'$_{12}$, and Q'$_{13}$ and n-channel MOS transistors Q'$_1$, to Q'$_3$, Q'$_6$ to Q'$_{11}$ and Q'$_{14}$ and Q'$_{15}$. Reference BSR denotes a bus reset signal for resetting the data buses DB0 and $\overline{DB0}$; reference SBE denotes an enable signal for enabling the data latch; and reference R/W denotes a read/write signal for generating a read enable signal RE and a write enable signal. WE through an inverter INV$_3$.

When the bus reset signal BSR becomes a high level, the transistors Q'$_1$ to Q'$_3$ are turned ON, shorting the data buses DB0 and $\overline{DB0}$, and accordingly, resetting the latch circuit. When the data latch enable signal SBE becomes a high level after the signal BSR becomes a low level, a p-channel MOS transistor Q'$_{16}$ is turned ON by an inverted signal of the enable signal SBE through an inverter INV$_1$. As an n-channel MOS transistor Q'$_{17}$ is turned OFF, a voltage at a node NA1 becomes a power supply voltage V$_{CC}$. On the other hand, an inverted bus reset signal $\overline{BSR}$ inverted at an inverter INV$_2$ is supplied to a gate of a p-channel MOS transistor Q'$_{18}$, turning the MOS transistor Q'$_{18}$ OFF. An n-channel MOS transistor Q'$_{19}$ is turned ON, and as a result, a voltage at a node NA2 becomes ground level. Accordingly, a latch circuit consisting of the transistors Q'$_4$ to Q'$_7$ is made active. When the data bus DB0 is a high level and the data bus $\overline{DB0}$ is a low level, the transistors Q'$_4$ and Q'$_7$ are turned ON and the transistors Q'$_5$ and Q'$_6$ are turned OFF, maintaining the above high level on the data bus DB0 and the low level on the data bus $\overline{DB0}$. Furthermore, when the read/write signal R/W is high level indicating the read operation the transistors Q'$_{12}$ to Q'$_{15}$ are turned ON, outputting a high level on the data bus DB0 and a low level on the data bus $\overline{DB0}$ to the second multidirection selection circuit 16A through a switching circuit consisting of the transistors Q'$_{12}$ to Q'$_{15}$ and a pair of buses BSO and $\overline{BSO}$. At this time, the transistors Q'$_8$ and Q'$_9$ are kept OFF. A circuit consisting of the transistors Q'$_8$ to Q'$_{11}$ does not effect the above operation.

The circuit on the left in FIG. 18 and enclosed by a one-dotted line is commonly used for the latch circuits, as shown in FIG. 17.

Figure 19:
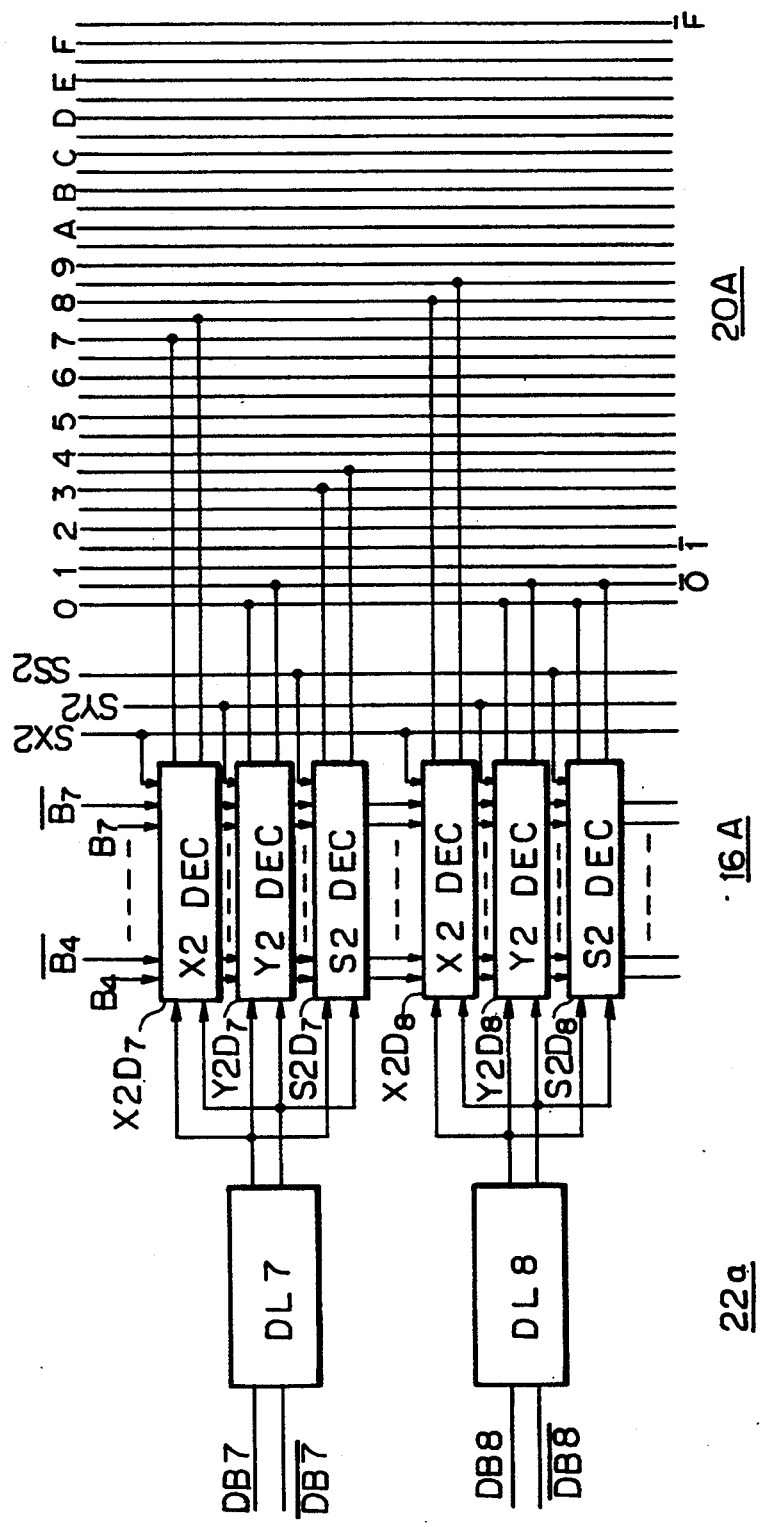
FIG. 19 is a circuit diagram illustrating the connection between a multidirection selection circuit and a latch circuit shown in FIG. 16.

FIG. 19 shows the detailed connections between the latch circuit 22a and the second multidirection selection circuit 16A and between the second multidirection selection circuit 16A and the second data bus 20A. One group of 16 groups in each second multidirection selection circuit 16A consists of three second X, Y, and S decoders, for example, X2D$_7$, Y2D$_7$, and S2D$_7$. These second decoders commonly receive data from the latch circuit DL7. These second decoders also commonly receive second segment address of B$_4$ and $\overline{B}_4$ to B$_7$ and $\overline{B}_7$. One of these second decoders, for example, X2D$_7$, Y2D$_7$, and S2D$_7$, is energized by one of the second direction signals SX2, SY2, and SS2.

Figure 20:
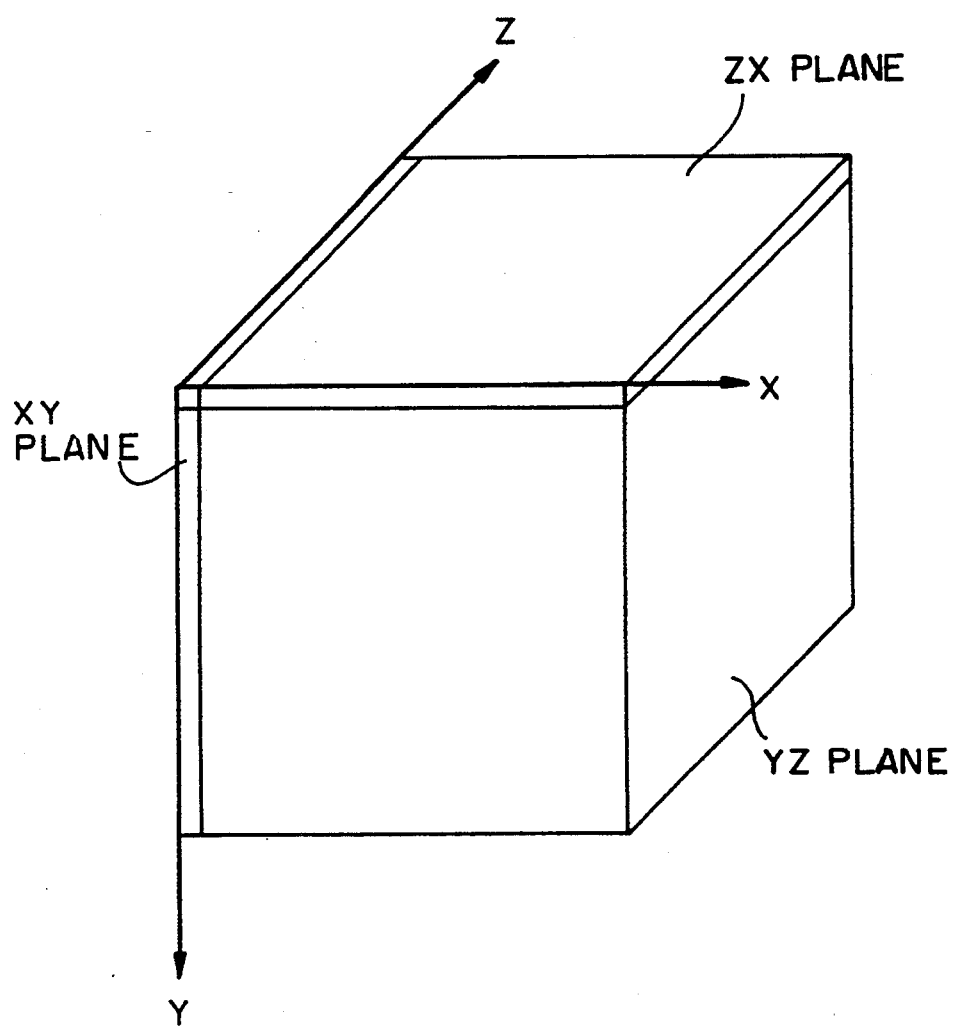
FIG. 20 is a view illustrating a data access arrangement applied to the circuit shown in FIG. 16.

A combination of the first and second multidirection selection circuits, can provide any one data selection within three dimensional data arrangements, i.e., the XY plane and the Z direction, the YZ plane and the X direction, and the ZX plane and the Y direction, as shown in FIG. 20. FIG. 21a is a specific example of the three dimensional data arrangements shown in FIG. 20. The three dimensional data arrangement in FIG. 21a is $16 \times 16 \times 16$ bits. According to all combinations of the first and second multidirection selection, nine data selections can be achieved as shown in Table 5. However, the same data selections exist (marked with a star) and thus, in practice, the data selection is six.

TABLE 5

| 1st SEL | 2nd SEL | SELECTED DATA | |
|---|---|---|---|
| X1 | X2 | X DIRECTION | FIG. 21b |
| | Y2 | Z DIRECTION | FIG. 21e |
| | S2 | ZX PLANE | FIG. 21g |
| Y1 | X2 | Y DIRECTION | FIG. 21c |
| | Y2 | * Z DIRECTION | FIG. 21e |
| | S2 | YZ PLANE | FIG. 21f |
| S1 | X2 | XY PLANE | FIG. 21d |
| | Y2 | * Z DIRECTION | FIG. 21e |
| | S2 | * ZX PLANE | FIG. 21g |

Each direction data consists of serial 16 bits of data. Each plane data consists of $4 \times 4$ square bits of data.

When the first multidirection selection in the X direction is carried out, all data in the second multidirection selection circuit of 16A to 16P is data in the ZX plane. This data is called intermediate segment data. Further, when the second multidirection selection in the X direction is carried out, the X direction data as shown in FIG. 21b is obtained. Alternatively, when the second multidirection selection in the Y direction is carried out, the Z direction data as shown in FIG. 21e is obtained. When the second multidirection selection in the S plane is carried out, the ZX plane data as shown in FIG. 21g is obtained.

To ensure a connection between the first segment address of $B_0$ and $B_0$ to $B_3$ and $B_3$ and the second segment address of $B_4$ and $B_4$ to $B_7$ and $B_7$, the first multidirection selection circuit and the second multidirection selection circuit must be subjected to a predetermined limitation. If the arrangement between the first multidirection selection circuit and the sense amplifiers is freely set, the arrangement between the second multidirection selection circuit and the latch circuits must be set to a predetermined pattern, or vice versa.

Referring to Table 5, when X1 and Y2, Y1 and Y2, and S1 and Y2 are given, the Z direction data are obtained. However, the actual data obtained depends on the segment addresses $B_0$ and $B_0$ to $B_3$ and $B_3$, and, $B_4$ and $B_4$ to $B_7$ and $B_7$.

In order to avoid a complex addressing, the redundant selection marked with the stars in Table 5 should be omitted. This can be achieved by predecoding. Table 6 shows an example of such a combination.

TABLE 6

| $V_3$ | $V_2$ | $V_1$ | No. | SELECTION DATA | $X_1$ | $Y_1$ | $S_1$ | $X_2$ | $Y_2$ | $S_2$ |
|---|---|---|---|---|---|---|---|---|---|---|
| 0 | 0 | 1 | 1 | X | 1 | 0 | 0 | 1 | 0 | 0 |
| 0 | 1 | 0 | 2 | Y | 0 | 1 | 0 | 0 | 1 | 0 |
| 0 | 1 | 1 | 3 | XY PLANE | 0 | 0 | 1 | 1 | 0 | 0 |
| 1 | 0 | 0 | 4 | Z | 1 | 0 | 0 | 0 | 1 | 0 |
| 1 | 0 | 1 | 5 | YZ PLANE | 0 | 1 | 0 | 0 | 0 | 1 |
| 1 | 1 | 0 | 6 | ZX PLANE | 1 | 0 | 0 | 0 | 0 | 1 |
| 0 | 0 | 0 | | | 0 | 0 | 0 | 0 | 0 | 0 |

TABLE 6-continued

| $V_3$ | $V_2$ | $V_1$ | No. | SELECTION DATA | $X_1$ | $Y_1$ | $S_1$ | $X_2$ | $Y_2$ | $S_2$ |
|---|---|---|---|---|---|---|---|---|---|---|
| 1 | 1 | 1 | | | | | | | | |

In Table 6, $V_3$, $V_2$ and $V_1$ are direction designation bits obtained from an external circuit.

The selection in Table 6 can be realized by, for example, a three-input and six-output ROM. That is, the ROM reads three inputs for the direction designation of $V_3$, $V_2$, and $V_1$ and outputs six outputs of $SX_1$, $SY_1$, $SS_1$, $SX_2$, $SY_2$, and $SS_2$. If the data access for the YZ plane and the ZX plane is not necessary, the S decoder in the second multidirection selection circuit can be omitted. Alternatively, if the data access for the XY plane is not necessary, the S decoder in the first multidirection selection circuit can be omitted. Therefore, the first and second multidirection selection circuits do not always have the same circuit construction. These selection circuits depend on the selection requirement.

Figure 22:
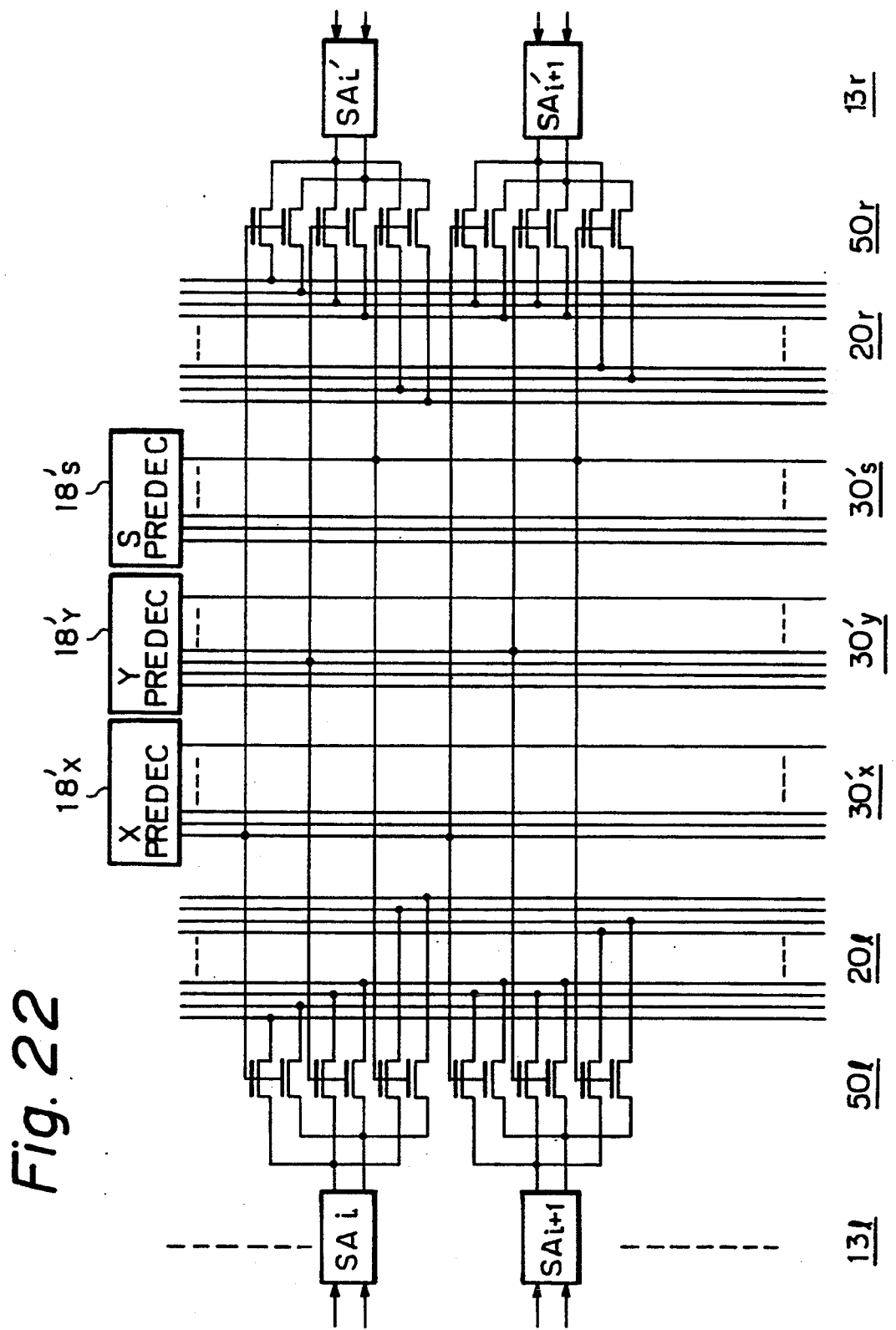
FIG. 22 is a circuit diagram of yet another embodiment of a selection circuit shown in FIG. 16.

Referring back to FIG. 16, adjacent memory cell arrays, for example, 10a and 10b, are simultaneously and multidirectionally selected by a same row address. Accordingly, two adjacent first multidirection selection circuits can be commonly used. FIG. 22 is a circuit diagram of a common selection circuit. An exclusive X direction selection line $30'_x$ connected to a X predecoder $18'_x$, an exclusive Y direction selection line $30'_y$ connected to a Y predecoder $18'_y$, and an exclusive S plane selection line $30'_s$ connected to an S predecoder $18'_s$ are commonly used. A data bus $20_l$ is connected to the sense amplifier circuit $13l$ through a gate circuit $50_l$. A data bus 20 is connected to the sense amplifier circuit 13 through a gate circuit $50_r$.

Figure 23:
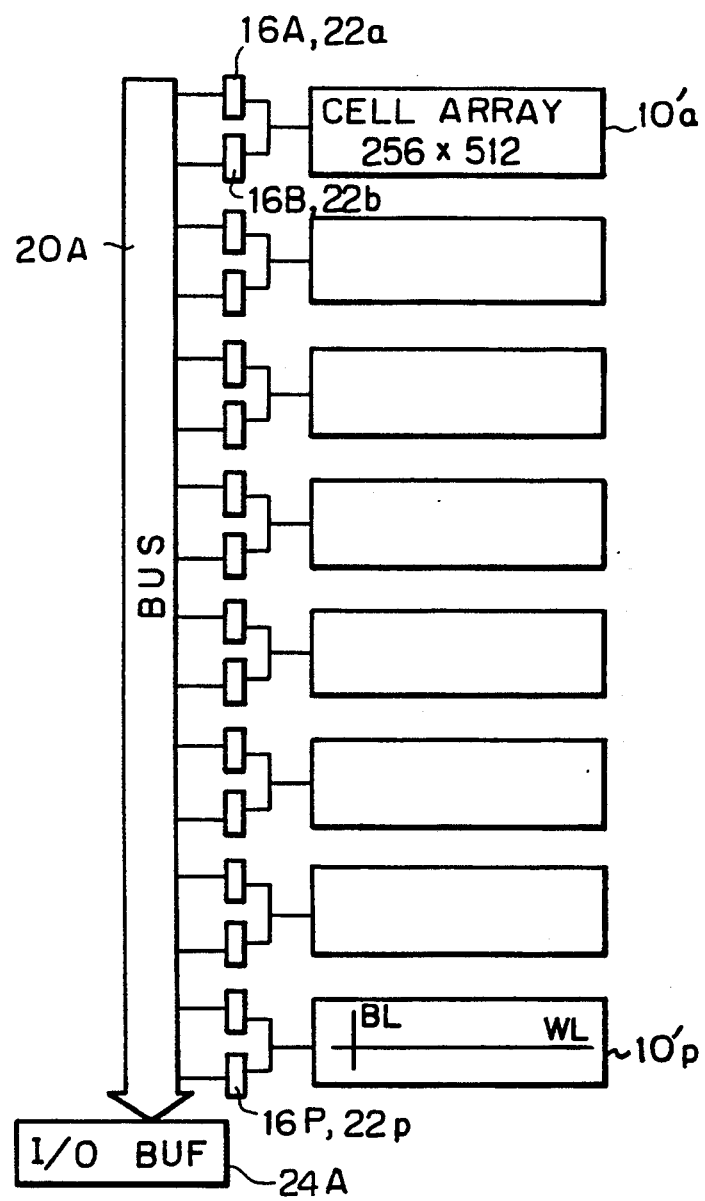
FIG. 23 is a block diagram of yet another embodiment of a semiconductor memory device according to the present invention.

To reduce the number of circuit elements, a time division operation may be applied. FIG. 23 is a block diagram of a semiconductor memory device which operates in a time sharing mode. Each memory cell array, for example, $10'a$, consists of 512 word lines $\times$ 256 bit lines. That is, the capacity of each memory cell array in FIG. 23 is twice that of FIG. 16. On the other hand, the number of the memory cell arrays is reduced by a half. The second data bus 20A is used by time sharing.

The operation of the memory device shown in FIG. 23 will be described in detail with reference to FIGS. 24a to 24g.

Figure 24:
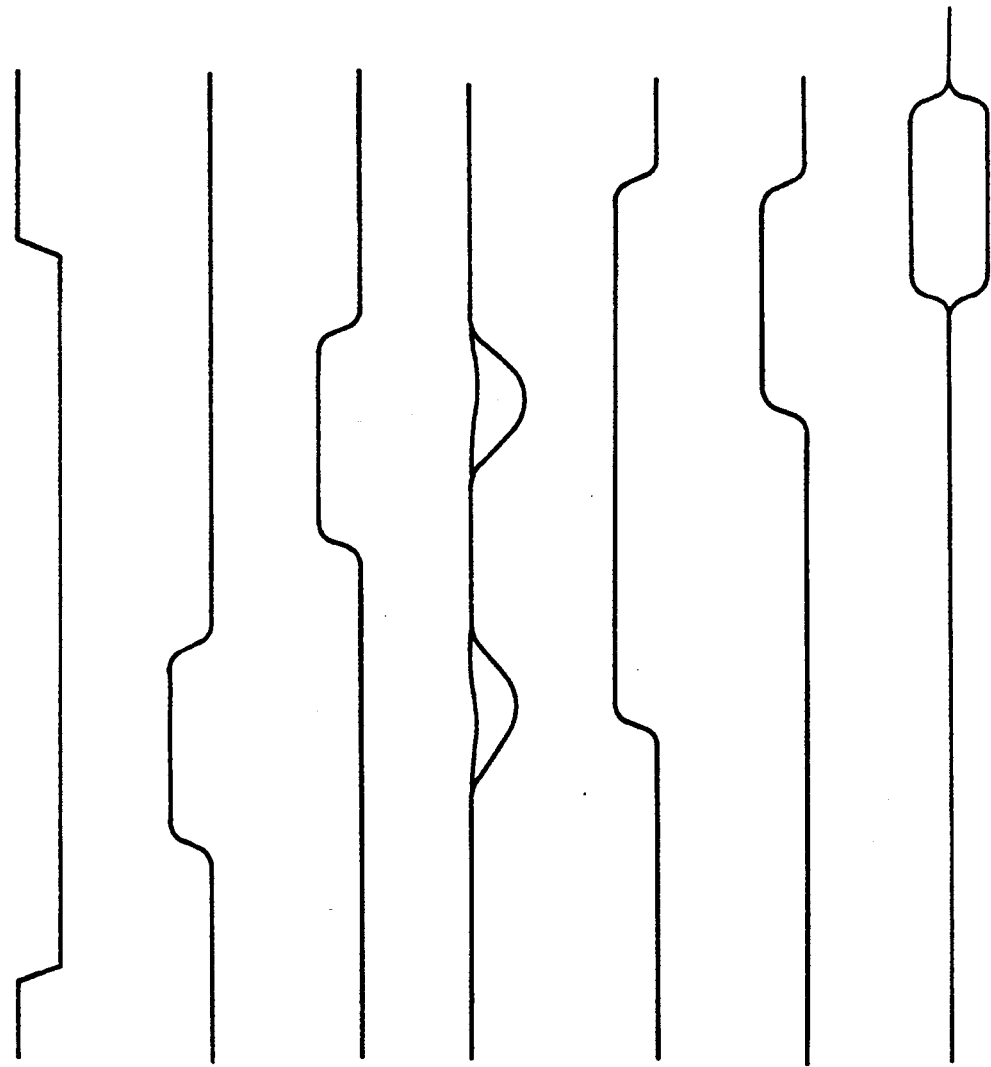
FIGS. 24a to 24g are timing charts illustrating the operation of the memory device shown in FIG. 23.

In the read mode, an inverted row address strobe signal $\overline{RAS}$ becomes a low level (FIG. 24a). The word line $WL_i$ in the memory cell array $10'a$ is selected, outputting 256 data on the bit lines (FIG. 24d). Thereafter, the first data latch enable signal SBE having a high level is output to the selection circuit of 16A and 22a, (FIG. 24e), holding the data on the bit lines in the selection circuit of 16A and 22a. Next, the word line $WL_{i+1}$ in the memory cell array $10'a$ is selected, also outputting other 256 data on the bit lines (FIG. 24d). The second data latch enable signal SBE' having a high level is output to the selection circuit 16B (FIG. 24f), holding the data on the bit lines in the selection circuit 16B. The data in the selection circuits 16A and 16B are consecutively output to the data bus 20A and to the external circuit (not shown) through the input/output buffer 24A.

Figure 25:
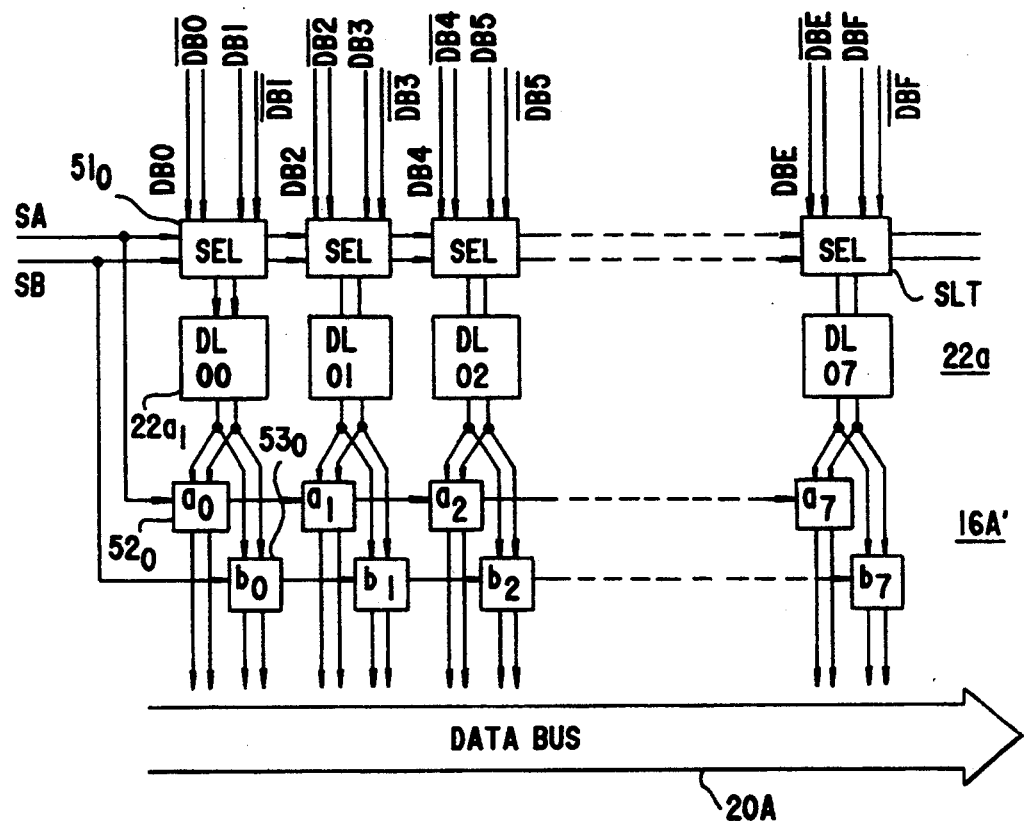
FIG. 25 is a circuit connection diagram of selectors, latch circuits and a data bus shown in FIG. 23.
Figure 26:
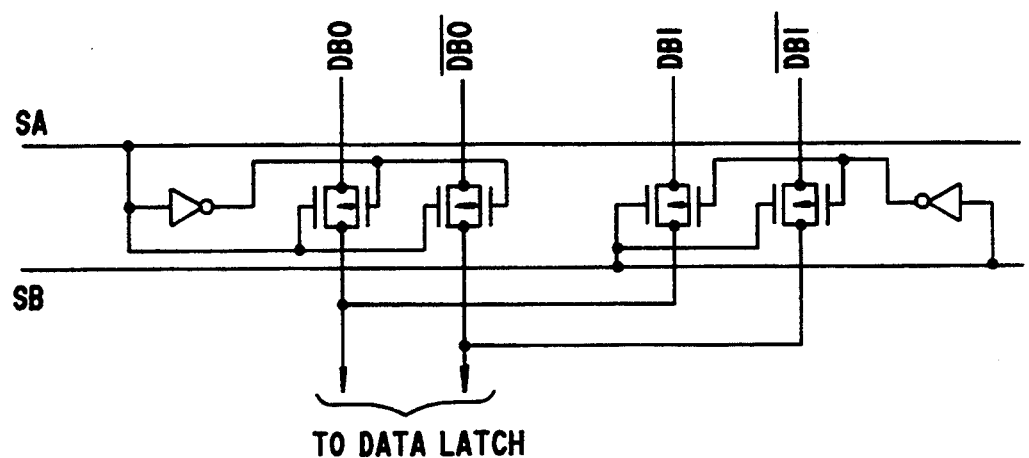
FIG. 26 is a circuit diagram of a selector shown in FIG. 25.
Figure 27:
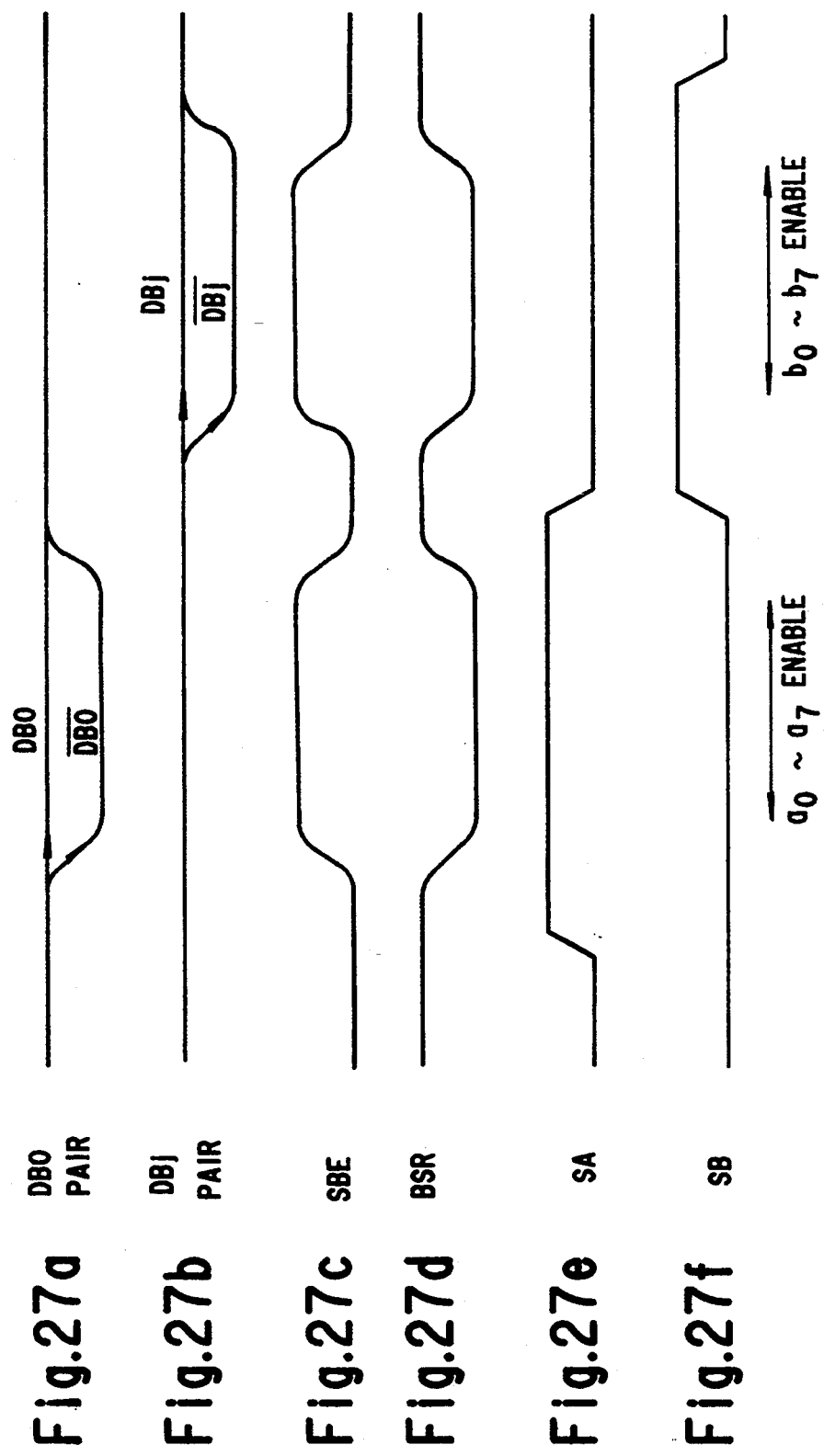
FIGS. 27a to 27f are timing charts of the circuits shown in FIG. 25.

The latch circuits in the selection circuit can be reduced by a half. FIG. 25 is a circuit diagram of this type of circuit. A selector $51_0$, a detailed circuit of which is shown in FIG. 26, receives two bit data from the data buses DB0 and DB0, and DB1 and DB1 and outputs either one of the data in response to either one of selection signals SA and SB. The latch circuit 16$a_1$ in the first multidirection selection circuit 16$a$ receives the output data. Either one of the latch circuits 52$_0$ and 53$_0$ in the second multidirection selection circuit 16A' receives the data from the latch circuit 16$a_1$, and outputs the data to the data bus 20A. The above operation is shown in FIGS. 27$a$ to 27$f$.

Figure 28:
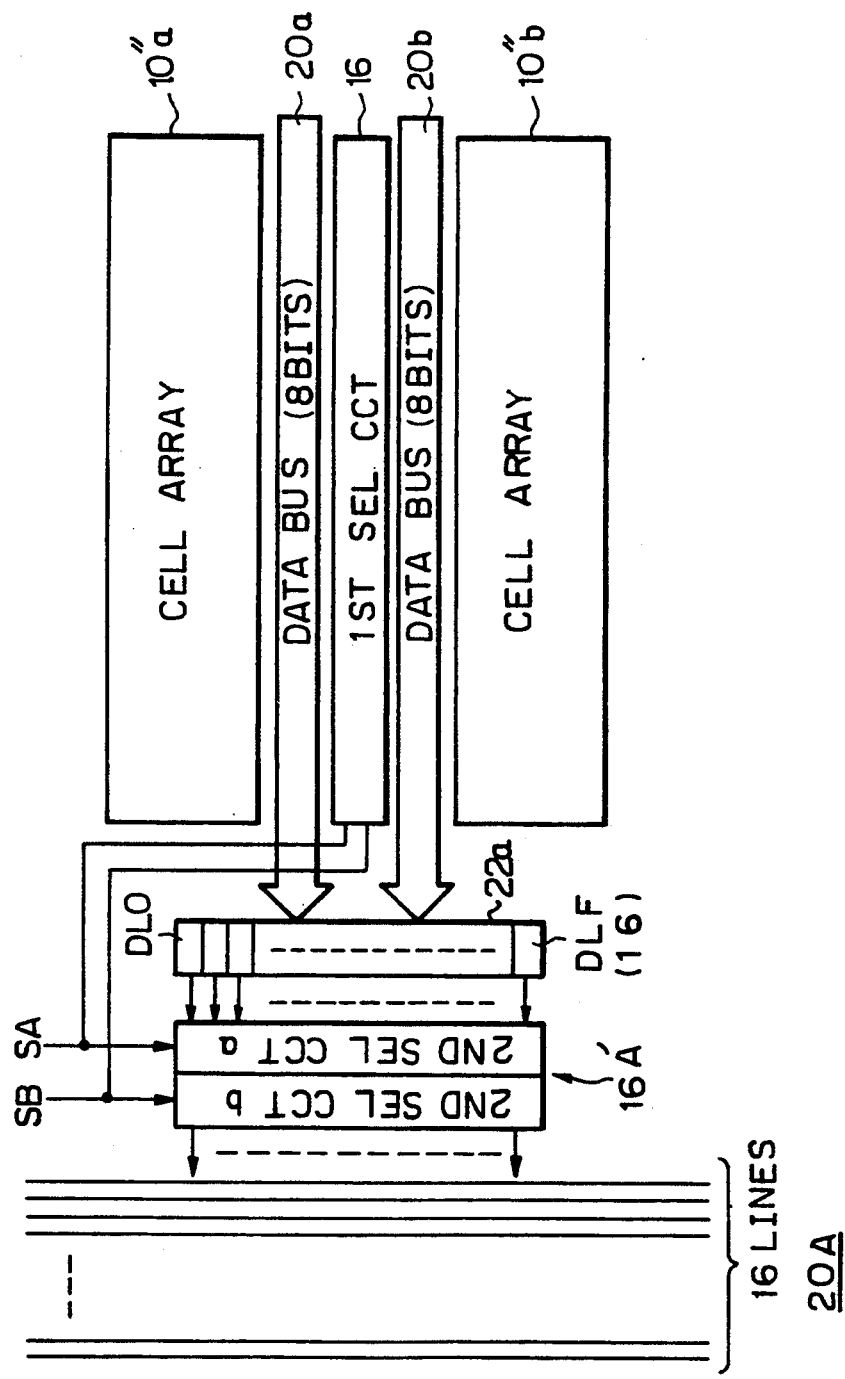
FIG. 28 is a block diagram of another embodiment of a semiconductor memory device according to the present invention.

The above common use and time sharing can be combined. FIG. 28 is a block diagram of a combined semiconductor memory device. The memory device includes memory cell arrays 10"$a$ and 10"$b$ data buses 20$a$ and 20$b$, the first multidirection selection circuit 16, the latch circuit 16$a$, the second multidirection selection circuit 16A', and the second data bus 20A.

Figure 29:
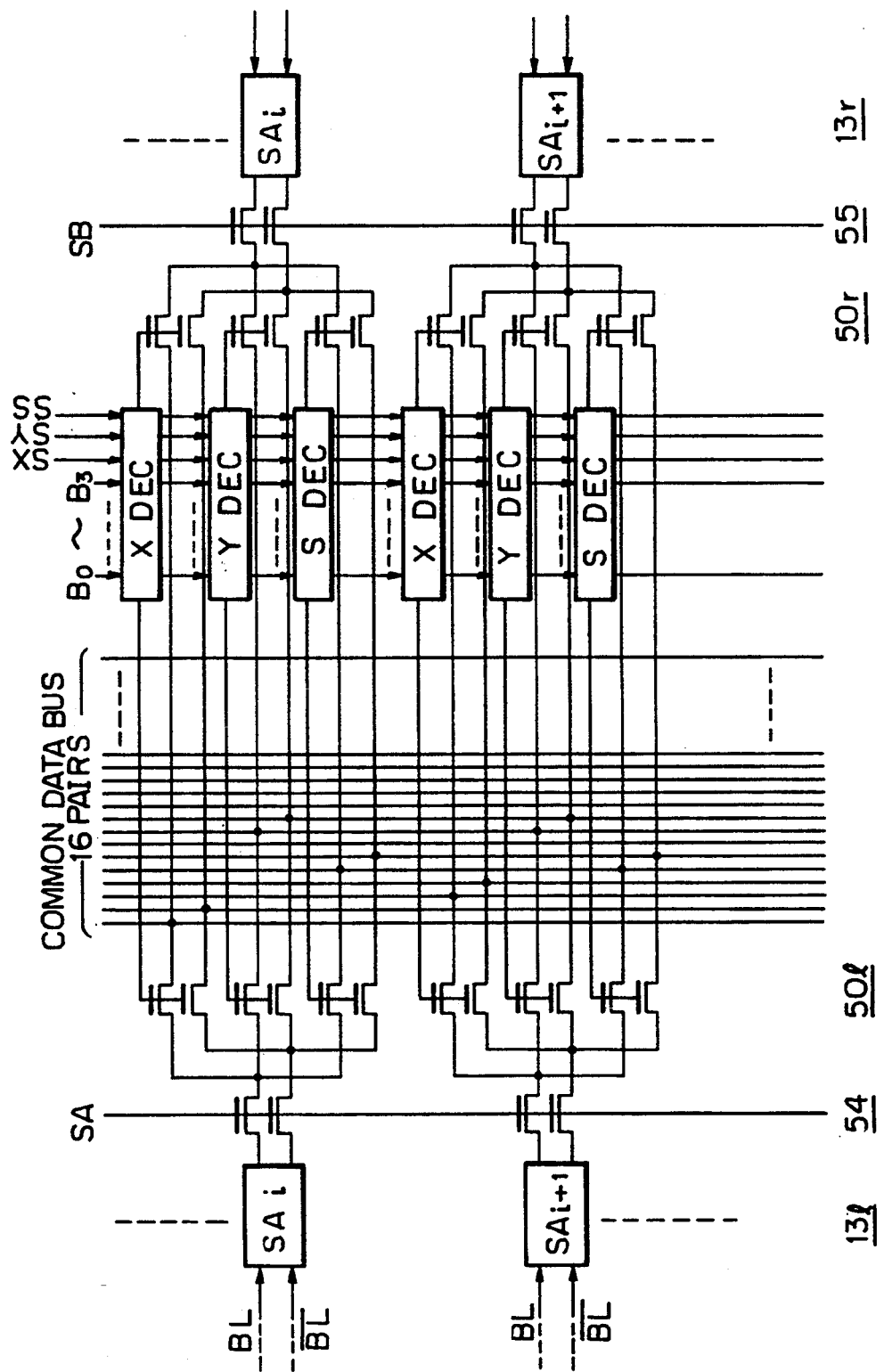
FIG. 29 is a circuit diagram of a selection circuit shown in FIG. 28.

FIG. 29 is a circuit diagram of a combination of the common data bus and the common multidirection selection circuit. The circuit shown in FIG. 29 differs in the following points from the circuit shown in FIG. 22: the provision of a left block selection gate circuit 54 energized by the selection signal SA, the provision of a right block selection gate circuit 55 energized by the selection signal SB, the provision of the X, Y and S direction decoders for each sense amplifier, and the provision of the common data bus.

FIGS. 30$a$ to 30$e$ are timing charts illustrating the operation of the circuit shown in FIG. 29.

FIG. 31 is a block diagram of another semiconductor memory device. The data bus 20A' has eight bit lines. Eight bits of data on the data bus 20A' are alternatively inserted into two latch circuits 22A1 and 22A2 each having an eight bit length through a selector 51. The data in the latch circuits 22AI and 22A2 are output to the external circuit through the I/O buffer 24A.

In the above embodiments, folded DRAM devices were discussed, but the concept of the present invention can be easily applied to other types of memory devices, such as a static RAM device, and a ROM device for a read only operation. In addition, in the above embodiments, mainly a read operation was discussed, but a write operation obviously can be achieved by providing an input buffer or an input and output buffer as shown in FIGS. 23 and 31.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor memory device comprising:
   a plurality of bit lines separated into groups;
   a plurality of word lines;
   a plurality of memory cells connected to said bit lines and word lines;
   a row decoder, connected to said word lines, for selecting one of said word lines in response to a row address signal;
   a selection circuit including
   a) a plurality of column decoders, each column decoder receiving a column address signal and each column decoder for selecting a different group of said bit lines based upon said column address signal,
   b) a direction decoder, connected to said column decoders, for selecting one of three directions by selectively enabling one of said column decoders in response to a direction address signal, wherein data read out from the group of bit lines selected by the enabled one of said column decoders is selected, and wherein when said direction address signal changes and said column address signal does not change, different bits having a specific directional relationship from a specific bit can be selected; and
   output means for outputting said data read out from the group of bit lines selected by the enabled one of said column decoders corresponding to the selected one of said three directions.

2. A semiconductor memory device according to claim 1, wherein each of the groups of bit lines is separated into a plurality of subgroups, and each of said column decoders comprises a first decoder for selecting one of the groups and a second decoder for selecting one of the subgroups from the selected one of the groups.

3. A semiconductor memory device according to claim 1, wherein said memory cells comprise dynamic random access memory cells.

4. A semiconductor memory device according to claim 1, wherein said memory cells comprises static random access memory cells.

5. A semiconductor memory device according to claim 1, wherein said memory cells comprise read only memory cells.

* * * * *